US007063541B2

(12) United States Patent
Grube et al.

(10) Patent No.: US 7,063,541 B2
(45) Date of Patent: *Jun. 20, 2006

(54) COMPOSITE MICROELECTRONIC SPRING STRUCTURE AND METHOD FOR MAKING SAME

(75) Inventors: Gary W. Grube, Pleasanton, CA (US); Igor Y. Khandros, Orinda, CA (US); Gaetan L. Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 841 days.

This patent is subject to a terminal disclaimer.

(21) Appl. No.: 09/746,716

(22) Filed: Dec. 22, 2000

(65) Prior Publication Data

US 2001/0012739 A1  Aug. 9, 2001

Related U.S. Application Data

(63) Continuation-in-part of application No. 09/023,859, filed on Feb. 13, 1998, now Pat. No. 6,520,778, and a continuation-in-part of application No. 08/819,464, filed on Mar. 17, 1997, now abandoned.

(51) Int. Cl.
*H01R 12/00* (2006.01)
(52) U.S. Cl. ...................................................... 439/66
(58) Field of Classification Search ................ 439/66, 439/81; 324/754, 762
See application file for complete search history.

(56) References Cited

U.S. PATENT DOCUMENTS

| | | | |
|---|---|---|---|
| 4,615,573 A | 10/1986 | White et al. | |
| 4,626,479 A * | 12/1986 | Hosoi et al. | ............... 428/663 |
| 4,893,172 A | 1/1990 | Matsumoto et al. | |
| 4,961,052 A | 10/1990 | Tada et al. | |
| 4,998,885 A * | 3/1991 | Beaman | ..................... 439/66 |
| 5,067,007 A * | 11/1991 | Kanji et al. | ................ 257/701 |
| 5,286,208 A | 2/1994 | Matsuoka | |
| 5,469,733 A | 11/1995 | Yasue et al. | |
| 5,475,318 A | 12/1995 | Marcus et al. | |
| 5,476,211 A | 12/1995 | Khandros | |
| 5,513,430 A * | 5/1996 | Yanof et al. | ................. 29/846 |
| 5,518,964 A | 5/1996 | DiStefano et al. | |
| 5,632,631 A | 5/1997 | Fjelstad et al. | |
| 5,666,190 A | 9/1997 | Quate et al. | |
| 5,723,894 A | 3/1998 | Ueno et al. | |

(Continued)

FOREIGN PATENT DOCUMENTS

JP   63-062343   3/1988

(Continued)

*Primary Examiner*—Neil Abrams
(74) *Attorney, Agent, or Firm*—N. Kenneth Burraston

(57) ABSTRACT

An improved microelectronic spring structure, and method of making the same, are disclosed. The improvement comprises, in a spring contact of the type comprising a beam attached to a post, of replacing the post with a plurality of column elements. The beam component is thus provided with one or more column elements which both structurally support and electrically connect one end of the beam to an electronic component. The column elements are preferably comprised of relatively straight segments of wire elements that are ball-bonded to a substrate and are over-coated with suitable structural and/or conducting materials. In the alternative, the improvement comprises a single column element comprised of a relatively straight segment of wire that is ball-bonded to a substrate and over-coated with suitable structural and conducting materials, wherein the column element is essentially rigid. The improved spring structures are especially useful for use as spring contacts on substrates such as probe cards, interposers, semiconductor devices, and other electronic components.

57 Claims, 11 Drawing Sheets

U.S. PATENT DOCUMENTS

| | | | |
|---|---|---|---|
| 5,773,889 A * | 6/1998 | Love et al. .................. | 257/737 |
| 5,790,377 A | 8/1998 | Schreiber et al. | |
| 5,810,609 A | 9/1998 | Faraci et al. | |
| 5,811,982 A | 9/1998 | Beaman et al. | |
| 5,828,226 A | 10/1998 | Higgins et al. | |
| 5,829,128 A | 11/1998 | Eldridge et al. | |
| 5,914,614 A | 6/1999 | Beaman et al. | |
| 5,917,707 A | 6/1999 | Khandros et al. | |
| 5,994,152 A | 11/1999 | Khandros et al. | |
| 6,013,571 A | 1/2000 | Morrell | |
| 6,014,032 A | 1/2000 | Maddix et al. | |
| 6,016,061 A | 1/2000 | Mizuta | |
| 6,031,282 A | 2/2000 | Jones et al. | |
| 6,049,976 A | 4/2000 | Khandros | |
| 6,059,982 A | 5/2000 | Palagonia et al. | |
| 6,072,190 A | 6/2000 | Watanabe et al. | |
| 6,142,789 A | 11/2000 | Nolan et al. | |
| 6,184,576 B1 | 2/2001 | Jones et al. | |
| 6,214,631 B1 | 4/2001 | Burrows et al. | |
| 6,229,100 B1 | 5/2001 | Fjelstad | |
| 6,289,583 B1 | 9/2001 | Belmont et al. | |
| 6,307,392 B1 | 10/2001 | Soejima et al. | |
| 6,344,752 B1 | 2/2002 | Hagihara et al. | |
| 6,441,315 B1 * | 8/2002 | Eldridge et al. ............ | 174/260 |
| 6,525,551 B1 * | 2/2003 | Beaman et al. ............. | 324/754 |

FOREIGN PATENT DOCUMENTS

| | | |
|---|---|---|
| JP | 64-047090 | 2/1989 |
| JP | 2-034949 | 2/1990 |
| JP | 4-214650 | 8/1992 |
| JP | 4-240570 | 8/1992 |
| JP | 5-198716 | 8/1993 |
| JP | 6-267408 | 9/1994 |
| JP | 7-021968 | 1/1995 |
| JP | 7-33232 | 12/1995 |
| JP | 8-021841 | 1/1996 |
| JP | 9-127139 | 5/1997 |
| WO | WO 97/43653 | 11/1997 |
| WO | WO 98/11445 | 3/1998 |
| WO | WO 98/52224 | 11/1998 |
| WO | WO 00/28625 | 5/2000 |
| WO | WO 00/33089 | 6/2000 |

* cited by examiner

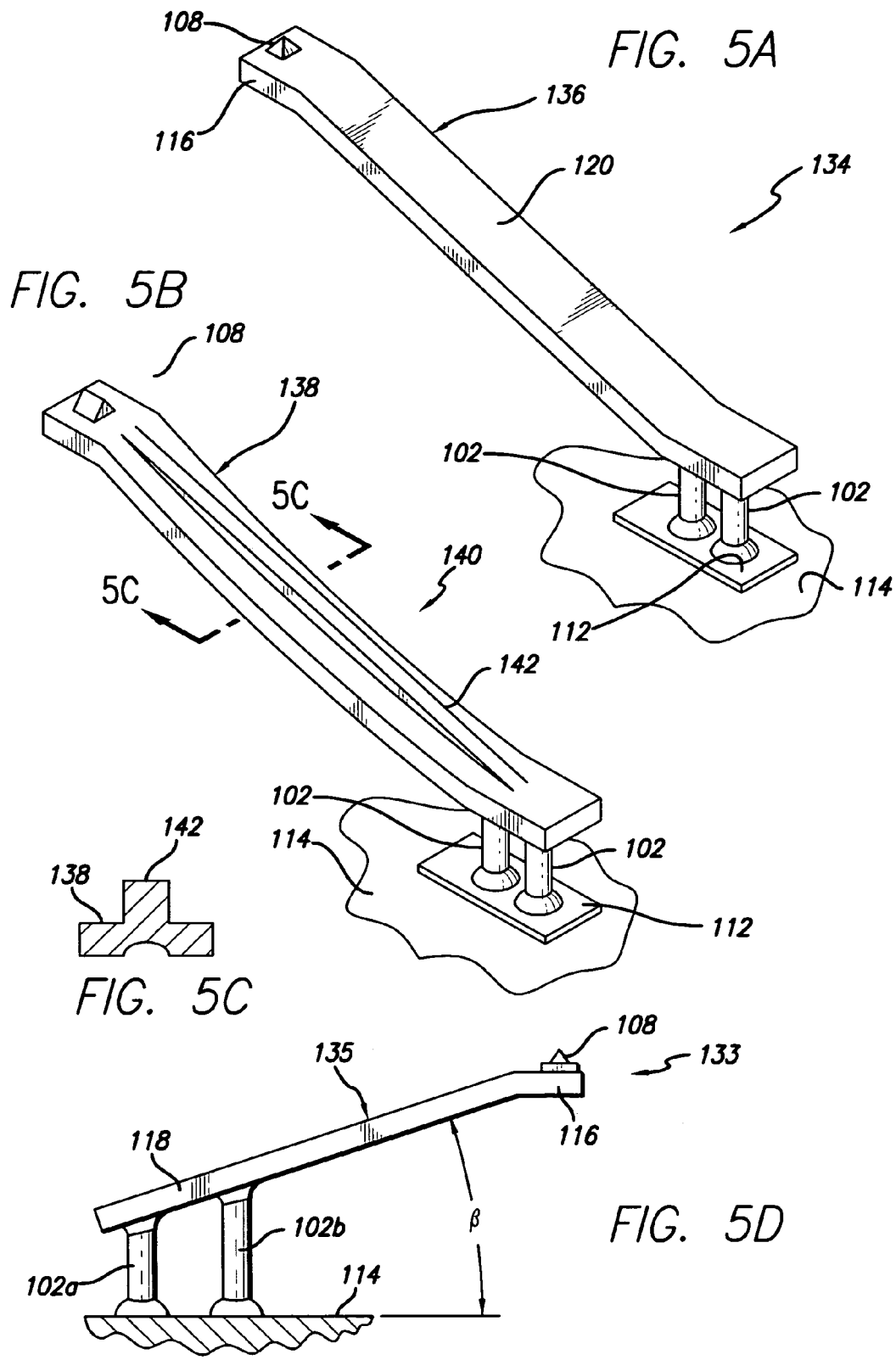

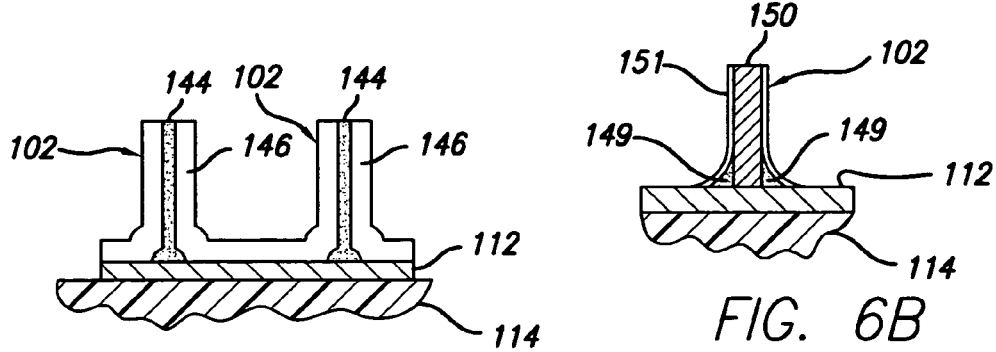
FIG. 6A
FIG. 6B
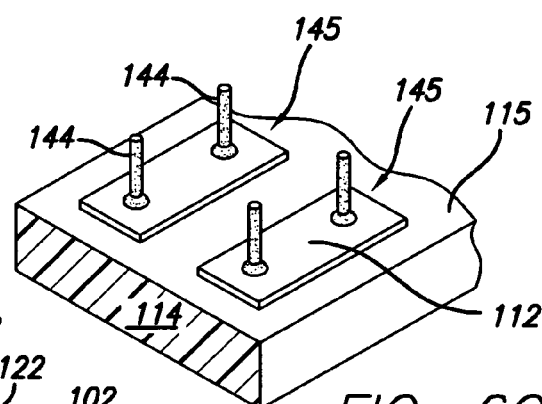
FIG. 6C
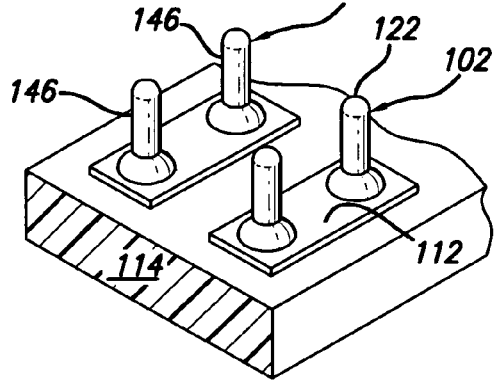
FIG. 6D
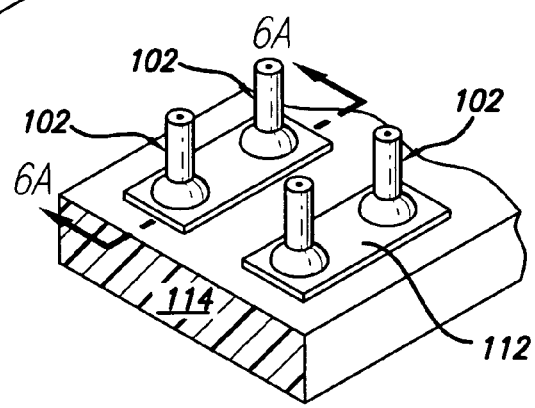
FIG. 6F
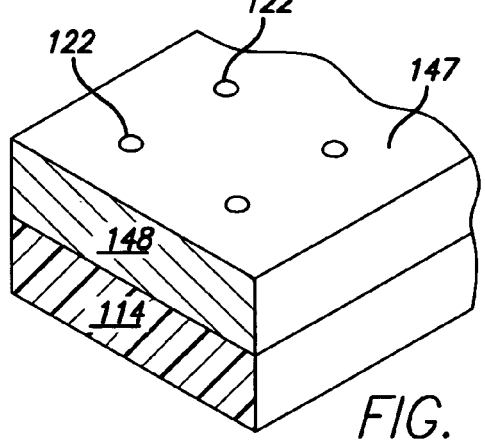
FIG. 6E

COMPOSITE MICROELECTRONIC SPRING STRUCTURE AND METHOD FOR MAKING SAME

RELATED APPLICATION

This application is a continuation-in-part of commonly-owned, application Ser. No. 09/023,859, filed Feb. 13, 1998 (now U.S. Pat. No. 6,520,778), and commonly-owned, application Ser. No. 08/819,464, filed Mar. 17, 1997, both of which are incorporated, in their entirety, by reference herein.

BACKGROUND OF THE INVENTION

1. Field of the Invention

The present invention relates to electrical interconnection (contact) elements and, more particularly, to contact elements which are resilient contact elements suitable for effecting readily demountable pressure connections between substrates, such as electronic components.

2. Description of Related Art

Readily demountable interconnections between electronic components include resilient spring elements of one electronic component being received by another electronic component at, for example, non-resilient contact elements such as pads or sockets. The spring elements exert a contact force (optionally, with a wiping action) on the contact elements in an amount sufficient to ensure a reliable electrical connection. Resilient spring elements or structures intended to make pressure contact with an electronic component, or other substrate, are referred to herein as "spring contacts." Both resilient and non-resilient elements or structures intended to make pressure contact with an electronic component or other substrate are generally referred to herein as "contact elements" and "contact structures," respectively. Elements that are sized for direct demountable connection to semiconductor devices, such as semiconductor dice or wafers, are referred to as "microelectronic" contact elements, contact structures, springs, spring contacts, spring elements, or spring structures.

Prior art techniques for making spring elements generally involve stamping or etching a sheet of spring material, such as phosphor bronze, beryllium copper, steel or a nickel-iron-cobalt (e.g., kovar) alloy, to form individual spring elements, shaping the spring elements to have a spring shape, optionally plating the spring elements with a good contact material (e.g., a noble metal such as gold, which will exhibit low contact resistance when contacting a like material), and forming a plurality of such shaped, plated spring elements into an array pattern. However, such techniques are not well suited for meeting the design requirements described below.

Stringent design requirements apply to microelectronic spring contacts. Generally, a certain minimum contact force is desired to achieve reliable electrical contact to electronic components. For example, a contact force of approximately 15 grams (including as little as 2 grams or less and as much as 150 grams or more, per contact) may be desired to ensure that a reliable electrical connection is made to a terminal of an electronic component. Such terminals are often contaminated with organic films, corrosion, or oxides on their contact surfaces, and the tip of the spring contact must be applied with sufficient force to penetrate this barrier of contamination. Additionally, it is preferable for the tip of a spring contact to move in an "x" direction (i.e., parallel to the surface of the connecting terminal) when it is depressed in a "z" direction (i.e., perpendicular to the terminal surface), thereby providing "wipe," which is useful for clearing contamination and ensuring a good connection. The tip should be disposed sufficiently above the substrate to which it is attached (i.e., the spring should have adequate "z-extension") to ensure that an electrical connection can be made without interfering with components, such as capacitors, which may be mounted to a surface of the components to be connected.

For any spring contact, the modulus of elasticity of the spring material in combination with the shape and size of the resilient working portion of the spring should be such that the spring contact reliably provides the minimum contact force needed to ensure debris removal and an electrical connection. Application and manufacturing considerations also constrain spring shape and size. When spring contacts are fabricated at ever-smaller microelectronic scales, it becomes increasingly difficult to fulfill these, and other, design requirements. For example, certain lithographic type contact structures typically include a beam with its smallest dimension (thickness) not greater than about 50 microns, and more typically about 0.04 to 20 microns. Of course, lithographic type contact structures can be fabricated at larger scales for some applications.

Various microelectronic spring contact structures have been developed for addressing the foregoing design requirements. There is room, nonetheless, for an improved spring structure, and particularly a cantilever-type structure with a relatively large z-extension, that is readily manufactured at a very fine pitch. Additionally, there is a need for a substantially non-resilient contact structure that similarly has a relatively large z-extension and is readily manufactured at a very fine pitch.

SUMMARY OF THE INVENTION

The present invention provides an improved microelectronic spring contact, and method of making the same, by improving on the spring contact structures described in the parent applications. One of the parent applications, Ser. No. 08/819,464 referenced above, describes a metallic structure having a separately formed pyramidal (or truncated pyramidal) tip on one end of a cantilever beam, the other end of which is joined to a free-standing resilient interconnection element. The cantilever beam tip structure can be fabricated by lithographic processes, and then joined to a distal end of free-standing resilient interconnection elements on an electronic component. Similarly, an array of cantilever tip structures can be fabricated on a sacrificial substrate and gang-transferred (mounted en masse) to distal ends of an array of resilient interconnection elements on an electronic component. Additional details concerning cantilever tips and processes for ball bonding and over-coating free-standing resilient interconnection elements on semiconductor substrates are described in U.S. Pat. No. 5,994,152 (Khandros et al.), which is incorporated by reference herein.

The other of the parent applications, Ser. No. 09/023,859 referenced above, describes a composite column element comprised of post, beam, and tip components, each of which are fabricated lithographically by depositing layers of metallic materials in patterns on various sacrificial substrates. The post, beam, and tip components are then assembled into a contact structure. In particular, the post component is formed by depositing a relatively thick layer of metallic or other conductive material in a recess formed in a relatively thick layer of photo-resist. The present invention eliminates the need to deposit these relatively thick layers.

The present invention improves upon the contact structures according to the parent applications. The improvement partly comprises a replacement of the post components disclosed in application Ser. No. 09/023,859 (e.g., post components 1020 therein) with one or a plurality of essentially non-resilient column elements. The beam and tip elements remain similar to those described in the referenced application. Each beam element is thus provided with one or more column elements which both structurally support and electrically connect one end of the beam to the electronic component. In one embodiment of the invention, the column elements are preferably comprised of relatively straight segments of wire elements that are ball-bonded to the electronic component and are over-coated with suitable structural and conducting materials.

The present invention thus provides at least the following advantages over the structures disclosed in the foregoing parent applications. The plural, ball-bonded columns require much less time and expense to manufacture compared to the lithographically fabricated column elements formed by deposition of a material on a substrate. This is particularly true when column elements that extend from the electronic substrate for more than about 50 microns (about 2 mils) are desired, because deep layering of photoresist materialsis avoided. Ball-bonded columns also eliminate the need for relatively time-consuming plating processes or other deposition of post materials. Additionally, grouped, plural columns as contemplated in an embodiment of the present invention may be made relatively long and slender while retaining adequate strength and stability. Such long, slender columns provide adjustability for the position of the spring contact tips. For example, contact tips that are manufactured slightly out of position may be restored to a correct position by slightly bending (i.e., plastically deforming) each column in an appropriate way, while the group of columns as a whole remains relatively rigid and stable. Plural columns are also more versatile than single post components, and are amenable for use in a wider variety of designs. The plural columns of the present invention also provide benefits for the electrical performance of a spring contact, such as reduced capacitance.

In general, the columns of the present invention can be combined with various contact elements, including contact pads and resilient beams, to provide various contact structures with elevated contact elements. Such structures may be made substantially non-resilient, or resilient, depending on application requirements. One of the embodiments of the invention comprises a substantially non-resilient contact structure further comprising a contact pad supported by a plurality of columns. This contact structure may be used to contact resilient and non-resilient contact elements of various types.

A more complete understanding of the composite microelectronic spring structure and the corresponding substantially non-resilient contact structure, and method for making them, will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

In the side views presented herein, often portions of the side view are presented in cross-section, for illustrative clarity. For example, in many of the views, the wire core of a element is shown full, as a bold line, while the overcoat is shown in true crosssection (often without crosshatching).

In the figures presented herein, the thickness of thin layer elements is generally exaggerated, i.e., not to scale relative to the thickness of other elements, for illustrative clarity. In general, elements in the figures are not drawn exactly to scale, and certain details may be represented schematically or omitted.

FIG. 5A is a perspective view of a composite microelectronic spring structure having a sloped beam extending in both x and z directions.

FIG. 5B is a perspective view of a composite microelectronic spring structure having a contoured beam component with a central rib.

FIG. 5C is a cross-sectional view of the beam shown in FIG. 5B.

FIG. 5D is a side view of a sloped beam structure having columns of unequal length.

FIGS. 6A and 6B are cross-sectional views of exemplary column elements.

FIGS. 6C–6E are perspective views of column elements, sacrificial layers, and related materials during exemplary steps of a method for making a composite microelectronic spring structure.

DETAILED DESCRIPTION OF THE PREFERRED EMBODIMENT

Figure 1:
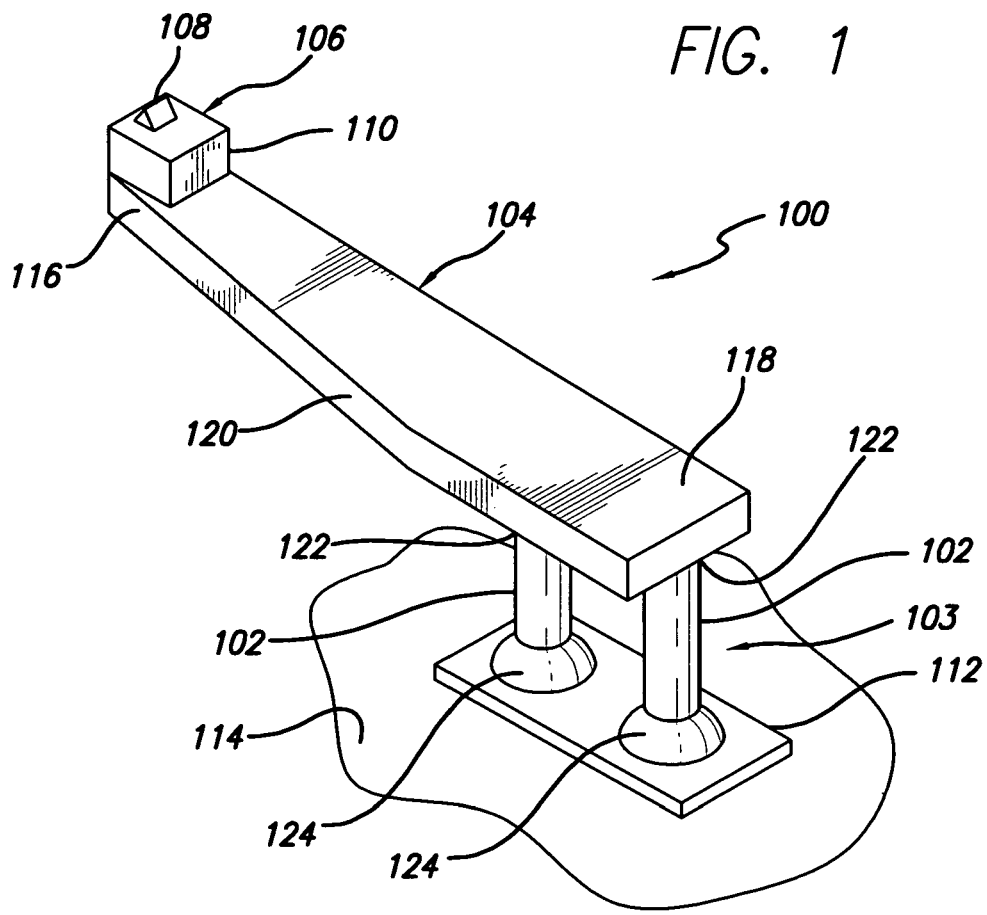
FIG. 1 is a perspective view of a composite microelectronic spring structure having dual column elements.

The present invention satisfies the need for a microelectronic spring structure, that overcomes the limitations of prior art spring structures. In the detailed description that follows, like element numerals are used to describe like elements illustrated in one or more figures.

Contact structures according to the present invention are particularly well-suited to making electrical connections to microelectronic devices having contact pads disposed at a fine-pitch, or where a large array of economical microelectronic spring contacts is desired; and particularly where a relatively large z-extension, such as greater than about 130 microns (5 mils), is desired. As used herein, the term "fine-pitch" refers to microelectronic devices that have their contact pads disposed at a spacing of less than about 130 microns (5 mils), such as 65 microns (2.5 mils). However, structures of the present invention may also be used in coarser-pitch applications, if desired. The advantages of the present invention are realized in part from the close tolerances and small sizes that can be realized by using lithographic rather than mechanical techniques to fabricate the contact elements, and in part from the improved z-extension and manufacturability associated with the relatively rigid column elements.

Resilient contact structures, as known in the art, are subject to particular performance requirements, which vary in degree between applications. These requirements typically relate to contact force, wipe, clearance, contact angle, elastic range, z-extension, repeatability, and longevity. "Resilient", as applied to structures, means structures that exhibit primarily elastic behavior and substantially deflect in response to an applied load, such as a contact force. In comparison, a "compliant" structure deforms in both elastic and plastic modes in response to an applied force. Finally, a relatively non-resilient or "rigid" structure, while exhibiting primarily elastic behavior, does not deflect substantially in response to an applied load. The specific meaning of "substantially deflect" may vary depending on the intended application for the structure, as follows. Generally, a deflection is substantial if it is great enough to perform or interfere with an intended function of the structure; for example, in a spring contact deflection providing a useful amount of wipe at the contact tip would be substantial. It should be understood that a structure may be relatively non-resilient or rigid in response to a first force vector, while being resilient in response to a second force vector in a direction different from the first vector, while also being compliant in response to a third vector in a direction different from the first two vectors. Similarly, a structure typically is first rigid, then resilient, and then compliant in response to a given force vector of increasing magnitude. The contact structures according to the present invention provide advantages for each of the foregoing performance areas, as is made apparent by the description that follows.

An exemplary microelectronic spring structure 100 for providing such advantages is shown in FIG. 1. The microelectronic spring structure 100 comprises column elements 102 and a contact element comprising a beam 104 formed of a resilient material, joined to the tops 122 of both column elements 102 at a fixed end 118 of beam 104. The column elements 102 are arranged in a group 103. Preferably, each column element 102 is substantially straight, and is aligned parallel to, and of equal length to, the other column elements 102 in group 103. The beam 104 is positioned transverse to each of the column elements 102 in group 103. Spring structure 100 preferably comprises, in addition, a tip structure 106, further comprising a contact tip 108 and a stand-off 110, joined to beam 104 adjacent to its free end 116. Column elements 102 are preferably connected at their bases 124 to a terminal 112 (e.g., a contact pad) of a substrate 114 or to a via in the substrate 114. Column elements 102 may also be mounted directly to substrate 114 for applications where a connection to a terminal is not needed.

In an embodiment of the invention, substrate 114 is a semiconductor substrate for an integrated circuit comprising numerous electrical terminals, one of which is shown as the terminal 112 in FIG. 1. Spring structure 100 provides for conduction of electrical signals and/or power between a contact tip 108 of beam 104, through the beam 104 of resilient material, and through columns 102 to terminal 112. Terminals 112 are typically coupled by conductive traces to an integrated circuit within substrate 114. Spring structure 100 is not limited for use on semiconductor substrates. For example, structure 100 may be used on a printed circuit board substrate, such as a probe card; or on a ceramic substrate, such as used for an interposer in a testing apparatus or a space transformer, on an electrical connector, or on various other substrates or on combinations thereof. Structure 100 is typically used to make an electrical connection to an electronic component, by contacting a terminal or contact pad of the electronic component with contact tip 108. Electronic components suitable for use with the invention include interconnect and interposer substrates; semiconductor wafers and dies; production interconnect sockets; test sockets; sacrificial members, elements and substrates; semiconductor packages, including ceramic and plastic packages, and chip carriers; and connectors.

Microelectronic contact structures according to the present invention are typically configured with a contact element comprising a cantilevered beam transverse to column elements 102, having a fixed end 118 attached to relatively rigid columns 102, and a free tip 116, as described above. The cantilevered beam is fixed at or adjacent to one end, having at least one end free to move in response to an applied force. This beam geometry is preferred for lithographic type, microelectronic spring contact structures according to the invention for several reasons. Lithographic manufacturing processes, unlike alternative spring manufacturing processes such as wire forming, are best suited for making shapes that may be defined by projection onto a surface. Such shapes are capable of being formed in a single step of a lithographic process. Therefore, the cantilevered beam configuration is desirable for lithographic springs because fewer process steps are required, and the spring structure can readily be formed from an integrated mass of material. Also, the cantilevered beam, with a single attached base and a tip on the opposite end of a spring beam, is more nearly statically determinate, and thus is more easily modeled and tested than more complex configurations, such as springs with more than one base. Additionally, the cantilevered beam is capable of resilient motion in at least two dimensions, thereby providing both wipe, desirable for making an electrical connection, and z-deflection, for compensating for misalignment between substrates, and for providing the spring force needed for maintaining an electrical connection. In alternative embodiments, the contact element is not cantilevered, and/or is not resilient. For example, one or more column elements may be used to elevate a contact pad above the surface of a substrate. Such structures may be either substantially resilient or substantially rigid.

Figure 2A:
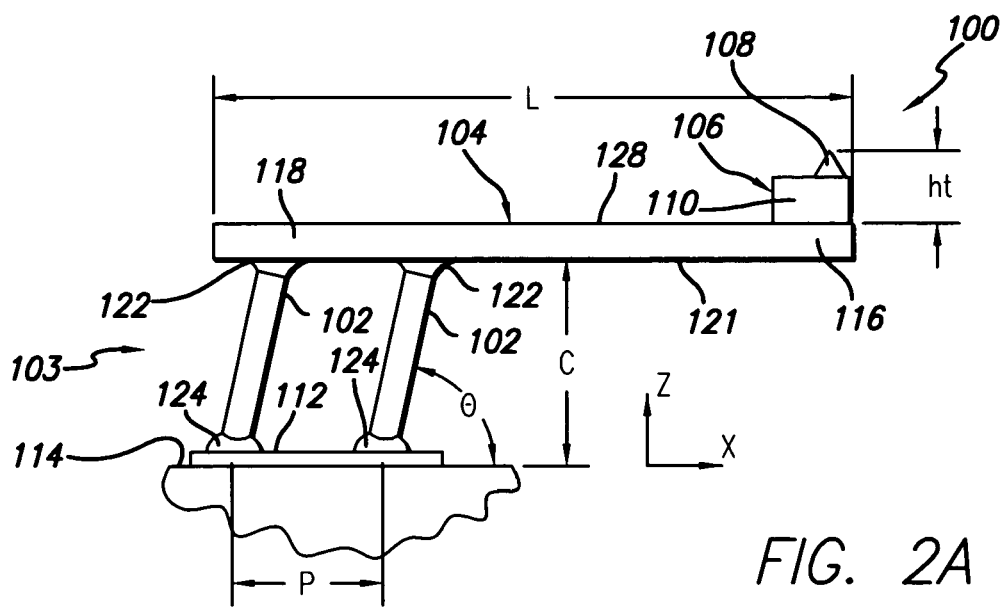
FIG. 2A is a side view of a composite microelectronic spring structure having dual column elements, showing the spring structure in an undeflected position.
Figure 2B:
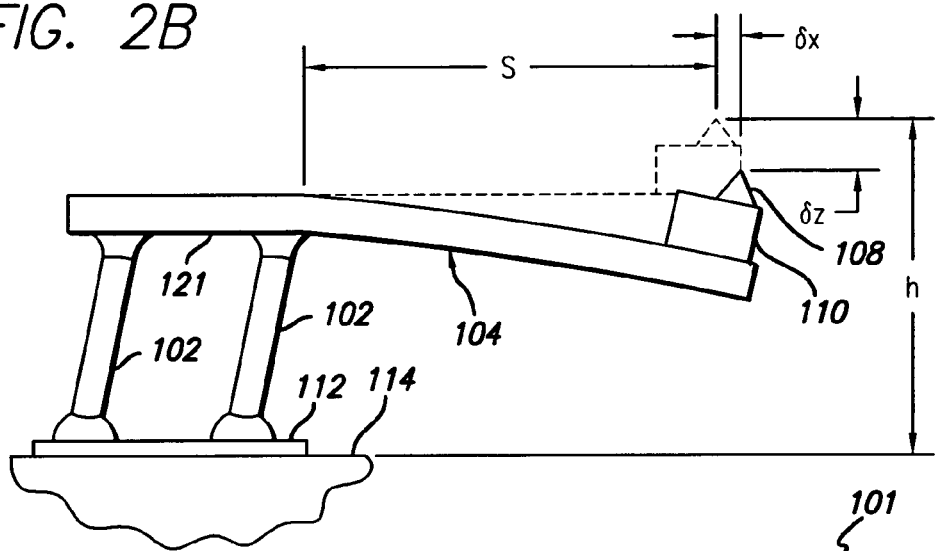
FIG. 2B is a side view of a composite microelectronic spring structure having dual column elements, showing the spring structure in a deflected position.

Basic geometric features of composite, cantilever-type, microelectronic spring structures according to the present invention are shown in FIGS. 2A and 2B. As indicated by axes 126 and as used herein, the direction normal to the upper surface of substrate 114 is the z-axis direction; the direction parallel to the projected length of beam 104 onto substrate 114 is the x-axis direction. A y-axis direction (not shown) is normal to the plane defined by the z-axis and x-axis.

In an embodiment of the invention, shown in FIGS. 2A and 2B, beam 104 of length "L" is joined at fixed end 118 to columns 102 at their respective tops 122. Column tops 122 are butted against a lower surface of beam 104 and joined to beam 104, for example, by soldering or brazing. Column bases 124 are positioned for attachment to a substrate; typical substrates are planar, and thus, column bases are typically aligned for attachment to a planar substrate, such as substrate 114 shown in FIG. 2A. However, the column bases 124 may also be configured for attachment to a non-planar substrate (not shown), if desired. Beam 104 extends substantially horizontally parallel to the surface of substrate 114, and has a free end 116 cantilevered from the group 103 of column elements 102. Tip structure 106, comprising stand-off 110 and contact tip 108, is positioned on beam 104 between free end 116 and group 103, and preferably adjacent to free end 116. Contact tip 108 is disposed a distance "$h_t$" above the upper surface 128 of beam 104. Upper surface 128 is opposite to the group 103 of column elements 102. Tip 108 is also located a distance "h" from the substrate surface, as shown in FIG. 2B, when beam 104 is in an undeflected position (shown in FIG. 2A and indicated by the dashed outline in FIG. 2B). As shown, h is typically equal to the beam clearance c, plus the beam thickness, plus $h_t$. However, h may also be less than c, for example, in embodiments (not shown) where the tip structure 106 is mounted on the lower surface 121 of beam 104.

In the embodiment shown in FIG. 2B, the spring structure is configured such that the top 122 of each column element 102 is substantially fixed while the free end 116 of the beam is free to deflect under a force applied to the beam 104 in a direction transverse to substrate 114. For example, when a vertical force is applied to the contact tip 108 towards substrate 114 (as by an approaching parallel substrate), the tip 108 and beam 104 are deflected to the position shown in FIG. 2B, while columns 102 are substantially fixed. Thus, the free tip of the beam is deflected a vertical distance "$\delta_z$" and a horizontal distance "$\delta_x$" (wipe or scrub). The contact force at the tip 108 is accordingly k multiplied by $\delta_z$, where k is the linear approximate spring rate of beam 104. At the point at which further deflection will cause the beam material to yield and plastically deform (that is, at the elastic limit of beam 104), the vertical deflection $\delta_z$ represents the elastic range of beam 104 in response to a vertical force.

It should be appreciated that if the column tops 122 are substantially fixed (i.e., much more rigid than the cantilevered portion of beam 104), the deflection of column elements 102 is readily made relatively small compared to the deflection of beam 104 at its elastic limit, and thus the vertical elastic range of beam 104 is readily made greater than the tip height $h_t$. Therefore, the upper surface 128 of beam 104 at its fixed end 118 can serve as a stop structure to prevent over travel of an approaching substrate and consequential plastic deformation of beam 104. A spring structure in which the columns tops are not substantially fixed is also with the scope of the invention. An example of a structure with more resilient columns is described below with respect to FIG. 3.

In an embodiment of the invention, columns 102 are parallel to one another, and inclined at an angle θ relative to the surface of substrate 114, and relative to a lower surface 121 of beam 104, as shown in FIG. 2A. Angle θ is preferably between about 70° and 110°, and more preferably between about 80° and 100°. An angle θ within these ranges (i.e., slightly off of perpendicular) is advantageous because the slight inclination permits a closer pitch "P" (spacing) between each column 102 in a group, when the column bases 124 are bonded to terminal 112 using conventional ball-bonding equipment. Also, an inclination close to perpendicular is advantageous for providing a relatively rigid attachment for the cantilever beam. Therefore, in certain of the preferred embodiments described herein, the columns 102 are either perpendicular to substrate 114 and to surface 121 of beam 104, or close to perpendicular.

Figure 3:
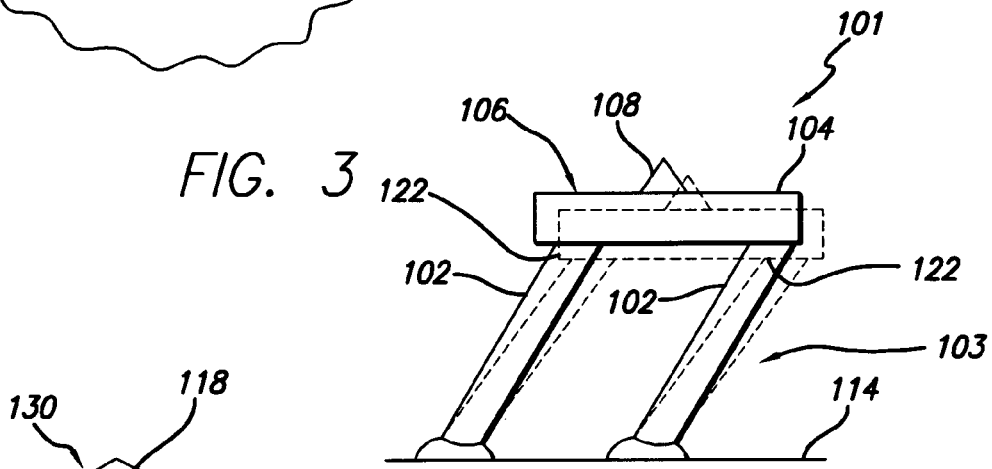
FIG. 3 is a side view of a composite microelectronic spring structure having dual column elements, with a dashed outline showing the spring structure in a deflected position.

In an alternative embodiment, the columns 102 are more inclined relative to substrate 114 (i.e., angle θ is outside of the preferred ranges stated above). In this alternative embodiment, columns 102 behave more like cantilevers than like columns, in that they are more resilient and may be reversibly deflected towards substrate 114. Cantilever action may be enhanced, if desired, by positioning contact tip 108 at an intermediate position between columns 102, i.e., over the group 103 of column elements 102, as shown in FIG. 3. In this embodiment, beam 104 serves as a platform or stand-off for contact tip 108, and has essentially no cantilever function. It should be apparent, as indicated by the dashed outline in FIG. 3, that column tops 122, and hence spring structure 101, will deflect vertically towards substrate 114, and in a horizontal direction, under the influence of a vertical contact force applied towards substrate 114 at contact tip 108. In yet another alternative embodiment, contact tip 108 may be omitted, and beam 104 may function as contact element without a tip, such as a contact pad.

Figure 4A:
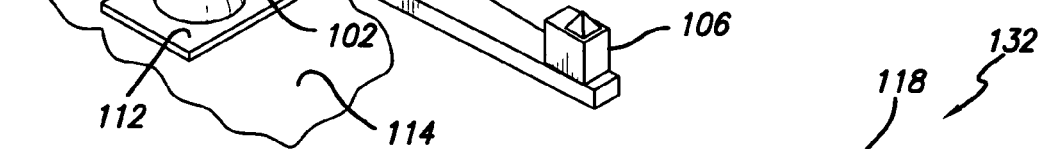
FIG. 4A is a perspective view of a composite microelectronic spring structure having single column element.

Further variations on the basic composite microelectronic spring structure are shown in FIGS. 4A–5D. A single-column structure 130 is shown in FIG. 4A. Structure 130 comprises a column 102, a beam 104, and a tip structure 106, as previously described. The configuration of beam 104 is generally the same as described for use with plural column elements. Single column 102 preferably comprises a substantially straight segment of wire coated or encased by a structural shell, and is constructed to be relatively rigid relative to beam 104. Beam 104 is joined at end 118 to the end of column 102. Column 102 is preferably inclined about 30° to 150° relative to beam 104 and substrate 114, and more preferably, about 900. The inclination angle is limited only by the orientation of beam 104. Single column structure 130 is preferably constructed such that the column top 122 will remain substantially fixed while beam 104 deflects under a force applied at tip structure 106 towards substrate 114.

Figure 4B:
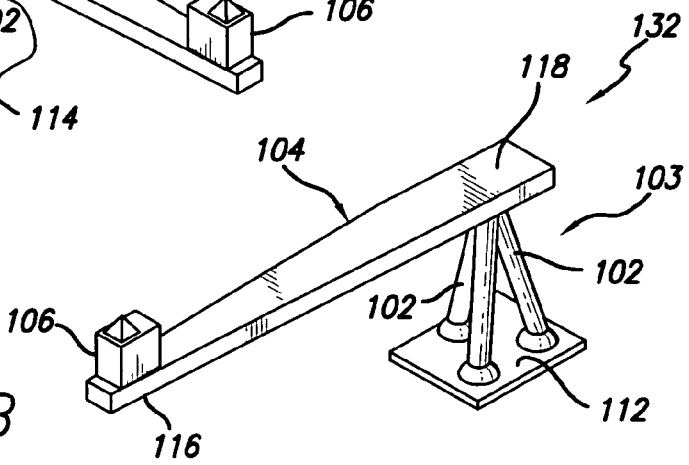
FIG. 4B is a perspective view of a composite microelectronic spring structure having three column elements in a tripod arrangement.
Figure 4C:
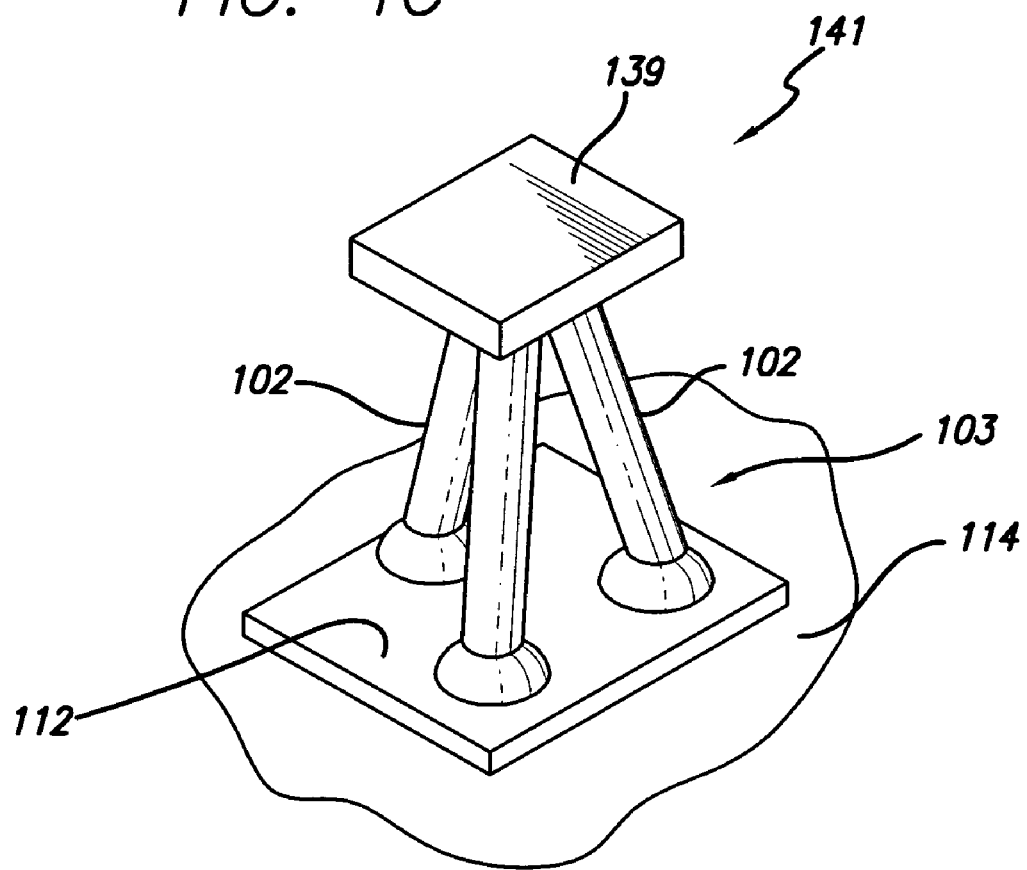
FIG. 4C is a perspective view of an alternative contact element, namely, a contact pad, supported by three columns, comprising a substantial non-resilient contact structure.

Similarly, more than two columns may be used, such as in the three-columned microelectronic spring structure 132 shown in FIG. 4B. Use of three columns is also exemplified by the structure 141 shown in FIG. 4C, wherein the beam structure shown in FIG. 4B has been replaced with an elevated contact pad 139 joined to each of the three columns 102. For both structures shown in FIGS. 4B and 4C, the three columns may be disposed in a parallel arrangement, or in the converging tripod arrangement as shown. In the alternative, diverging columns, or combinations such as one in which two or more columns are parallel, and additional columns are diverging or converging, may be implemented, if desired. It should be apparent that a greater or lesser number of columns, for example, four columns or two columns, may also be used with both structures 132 and 141. Structure 141, comprising an elevated contact pad 139, is useful for certain applications, for example, probes for high-speed testing applications. The group of columns 103 may be configured to be relatively rigid, as shown in FIG. 4C, or relatively resilient, as shown in FIG. 3 and described above, depending on the requirements of the application. In comparison, the spring structure 132 shown in FIG. 4B, having a cantilevered beam secured to three columns, is preferably configured to behave similarly to the two-column cantilevered structures previously described.

To reduce the required length of columns 102, and/or to eliminate the need for a tip stand-off element such as stand-off 110, the beam may be sloped to provide additional z-extension, as shown in FIG. 5A. Intermediate portion 120 of beam 136 is sloped away from substrate 114 to provide additional z-extension, thereby eliminating the need for a stand-off 110. Tip 108 is thus joined directly to the free end 116 of beam 136; or in the alternative, a stand-off (not shown) as previously described may be used. A sloped beam may be advantageous for applications where relatively high z-extension is required. Manufacturing techniques for making sloped beams are further described in the co-pending applications referenced herein.

A contoured beam, such as beam 138 of structure 140, shown in FIG. 5B, may also be used to provide additional z-extension. Furthermore, a contoured beam can also be used to reduce the mass of structural material required to fabricate a beam of a given strength and stiffness. For example, a contoured beam may be provided with stiffening features, such as a central rib 142, shown in FIGS. 5B and 5C. As should be apparent from the cross-section of beam 138 shown in FIG. 5C, beam 138 is comprised of cross-sections having higher area moments of inertia relative to a rectangular cross section of equivalent area. Accordingly, to achieve a given stiffness, the area of each cross section may be reduced, thereby reducing the mass of beam 138 relative to a beam with rectangular cross sections, such as beam 136 shown in FIG. 5A. Beams with various contoured shapes may be combined with columns 102. Generally, contours in a direction perpendicular to the substrate 114 are particularly useful. Further exemplary contoured shapes are described in the co-owned, co-pending application Ser. No. 09/710,539, filed on Nov. 9, 2000.

The versatility of the plural-columned structures according to the present invention is further exemplified by the inclined beam structure 133 shown in FIG. 5D. In the embodiments described above, the tops of each column elements are disposed in a plane substantially parallel to a substrate. However, for some embodiments, it may be advantageous to dispose the tops of the column element in a plane inclined to a substrate. Structure 133 comprises such an inclined (sloped) beam 135, which is inclined at an angle p relative to substrate 114. The degree of inclination is controlled by the spacing, and the amount of height difference, between columns 102a and 102b. Rear column 102a is preferably shorter than forward column 102b, thereby inclining beam 135 away from substrate 114 at angle β. Angle β is preferably less than about 45°. Other details of structure 133 may be adapted from similar details described for multi-column structures generally.

The exemplary microelectronic contact structures described above characteristically have a beam joined, at the beam's first end and lower surface, to tops of a group of column elements. The exemplary structures also have a tip component joined to a second, free end and upper surface of the beam. However, the invention is not limited by this characteristic arrangement of elements. For example, column elements may be joined to the beam some distance away from the first, fixed end thereof, and the tip component may be joined to the beam some distance away from the second, free end thereof, without departing from the scope of the invention. Generally, it is preferred that the tip structure be joined at a position on the beam which is offset from the column elements, thereby providing a microelectronic contact structure with a cantilevered beam. However, as shown in FIG. 3, the tip structure may be positioned between adjacent column elements, provided the column elements themselves are configured to provide a range of flexure to the resulting contact structure.

It is similarly within the scope of this invention that the column elements are joined to the one surface of the beam, and that the tip structure is joined to the beam at other than its opposite surface. For example, in certain applications it may be desired to join both the column elements and the tip structure to the same surface of the beam. In other applications, the beam may be positioned so as to span between two columns and the tip be positioned at a mid-portion of the beam. In such an arrangement, the beam may take a variety of forms and shapes, such as an elongated s-shape, which will permit a wiping action when the tip is depressed upon contact with, for example, the pad of a corresponding electronic component. Or, it may be desired to join the tip structure to a surface of the beam that is adjacent, rather than opposite, the surface of the beam to which the column elements are joined. Each of the foregoing embodiments utilizes one or more column elements and a beam joined to the top of the column elements; accordingly, each of the embodiments is within the scope of the invention.

Figure 5E:
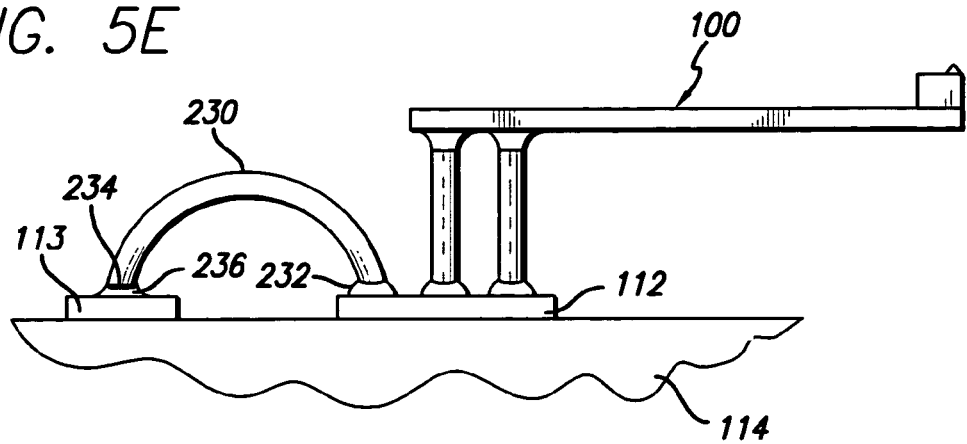
FIG. 5E shows a side view of a microelectronic spring structure, wherein one of the column elements is converted to a wire connector for connecting to an adjacent terminal.

The use of column elements comprised of wire cores that are plated with a structural material facilitates use of one or more of the wire cores as an electrical connector. FIG. 5E shows an exemplary microelectronic spring structure 100 connected to a terminal 112 by column elements 102, as previously described. In addition, wire connector 230 connects terminals 112 and 113. Wire connector 230 is advantageously formed in parallel with columns 102 as follows. First, wire cores for columns 102 and connector 230 are ball-bonded to terminal 112. Then, the wire cores for column elements 102 are cut to an appropriate length for supporting the beam of spring structure 100, and the wire core for connector 230 is cut to a length appropriate for connection terminal 112 to adjacent terminal 113. Then, the wire core for connector 230 is bent to contact terminal 113, and secured in place. Remaining steps for making spring structure 100 then proceed as described herein, resulting in the spring structure 100 and wire connector 230 as shown in FIG. 5E. Wire connector 230 is joined by ball-bonded at one end 232 to a first terminal, and joined at the other end 234 using a joining material 236, such as solder or conductive adhesive, to a second terminal. It is then coated with the same material as column elements 102, thereby firmly securing and connecting it to both terminals 112, 113.

Microelectronic spring structures according to the present invention are partly defined by the geometric features and assembled configurations as described above, and partly defined by the particular characteristics of their constituent parts, as described more fully below. The characteristics of these parts, in turn, may vary depending on the particular fabrication methods used to make them without departing from the scope of the invention. However, the parts have certain essential characteristics that are also noted in the description that follows.

Microelectronic Column Elements

Techniques for fabricating microelectronic spring structures that are ball-bonded to a substrate and subsequently plated with a resilient material may be adapted to make composite column elements for use in the present invention. Such techniques are described, for example, in U.S. Pat. No. 6,049,976, which is incorporated by reference herein. Several of the techniques disclosed therein, and methods for adapting the techniques for use with the present invention, are summarized below.

As shown in FIG. 6A, a composite column element according to the present invention preferably comprises a segment of wire, i.e., wire core 144, which is coated (such as by plating) with an appropriate material to: (1) establish the mechanical properties of the resulting composite column element; and/or (2) securely anchor the column element to a terminal 112 of an electronic component or other substrate. The over-coated material, comprising a shell 146 enclosing wire core 144, is generally a metal, such as nickel or alloy thereof, but may also be comprised of a suitably strong, non-metallic material. In an embodiment of the invention, the wire core 144 comprises a relatively soft material, such as gold, which is readily attached by ball-bonding to even the most fragile of electronic components. "Soft" in this context means a material with a relatively low modulus of elasticity, such as less than about 70 GPa (about 10 Mpsi). In comparison, a relatively rigid material is one having an elastic modulus greater than about 140 GPa (20 Mpsi).

For example, a typical column element, such as columns 102 shown in FIG. 6A, includes a wire core 144 of a soft material, such as gold, and a shell 146 of a relatively rigid material, such as a nickel alloy. The wire core 144 is typically a substantially straight segment, such as a round wire having a diameter of about 13 to 76 microns (about 0.5 to 3 mils), and is bonded to a terminal 112 of substrate 114. The nickel alloy shell 146 is applied over the wire core 144 by any suitable process, such as by a suitable plating process (e.g., by electrochemical plating), to a thickness of about 10 to 130 microns (about 0.4 to 5 mils). The entire column element 102 therefore is typically substantially cylindrical, with a diameter of about 34 to 340 microns (about 1.3 to 13 mils), and more typically about 50 to 100 microns (about 2 to 4 mils). In addition, it is generally preferred that the thickness of a structural shell (whether a single layer or a multi-layer overcoat) be sufficient to provide structural support to the column element, and therefore, the shell thickness will depend on the structural characteristics of the wire core selected, and the requirements of the application. It should be apparent that the shell, or at least an outer layer of a multi-layer shell, is preferably electrically conductive; however, the column element is not limited to being electrically conductive. By way of example but not of limitation, the column element may be a coaxial column.

Suitable materials for the wire core 144 include, but are not limited to: gold, aluminum, copper, and their alloys. These materials are typically alloyed with small amounts of other metals to obtain desired physical properties, such as with beryllium, cadmium, silicon, magnesium, and the like. In the alternative, but less preferably, silver, palladium, platinum, or other metals or alloys of the platinum group of elements may be used. Generally, a wire of a material, such as gold, that is amenable to bonding to a terminal 112 of an electronic component, using temperature, pressure and/or ultrasonic energy to effect the bonding, is especially preferred.

Suitable materials for structural shell 146 include, but are not limited to nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the platinum group and their alloys; tungsten and molybdenum. The structural shell 146 may comprise separate layers of materials selected from the above materials. For example, it is advantageous to apply a thin (such as about 5000 Angstroms) outer layer of gold on the column elements, as a protective and electrically conducting outer layer. In cases where a solder-like finish is desired, tin, lead, bismuth, indium and their alloys can also be used. Column elements 102 comprising these materials may be joined to beams 104 using, for example, solder constituted from lead, tin, indium, bismuth, cadmium, antimony and their alloys, conductive adhesive, pressure fitting, press fitting, friction fitting, snap fitting, or other connection methods.

The technique selected for applying these shell materials over the various core materials set forth above will vary, depending on the desired column properties and manufacturing processes available. Electroplating and electroless plating are generally preferred techniques. It should be appreciated that minor variations in column composition may be made to facilitate the chosen manufacturing method.

For more detailed example, an exemplary group of column elements as shown in FIG. 6A comprises a first straight segment of gold wire core 144 having a diameter of 38 microns (1.5 mils), ball-bonded to a substrate and cut to a length of 380 microns (15 mils). A second segment of gold wire core 144 is ball-bonded to the substrate, spaced about 115 microns (4.5 mils) from the first wire core, and cut to the same length. Both wire cores 144 are perpendicular to the substrate. The wires are plated with 19 microns (0.75 mils) of nickel, comprising shells 146. Preferably, each column element 102 then receives a final overcoat of 1.3 microns (about 50 micro inches) of gold (not shown), to reduce contact resistance and enhance conductivity of the column elements 102.

Typically, the wire core is circular in cross section, and therefore the column element is substantially cylindrical. However, the wire core need not have a round cross-section. For example, it may be a flat wire having a generally rectangular cross-section. Wire cores and column elements having other non-circular cross-sections, such as C-shaped, I-shaped, L-shaped and T-shaped cross sections, are also within the scope of the invention. However, round wire is generally preferred, because it is readily available, generally less expensive, and easier to handle than other wire types.

Preferably, the structural shell 146 of a column element covers not only the wire core 144, but also substantially all of the remaining exposed surface of the terminal 112 to which the column element is bonded, as shown in FIG. 6A. This securely and reliably anchors the column element to the terminal. Generally, it is only required that the overcoat material cover at least a portion of the terminal adjacent the core. It is generally preferred, however, that the overcoat material cover the entire remaining surface of the terminal. Preferably, each layer of the structural shell 146 is metallic.

A layered column element as described above, i.e., comprising a core 144 of relatively soft, less rigid material covered with a shell 146 of more rigid material, is generally the preferred form of column element for use in the embodiments of the present invention. However, it is also within the scope of the invention for the wire core 144 to comprise a more rigid material than shell 146, with the shell serving primarily to securely anchor the column element to a terminal of an electronic component.

In yet another embodiment of the invention, a unitary structure comprised of a wire or column segment 150 that is essentially free of any structural coating may also be employed, as shown in FIG. 6B. In this embodiment, the uncoated wire 150 is sufficiently strong and rigid by itself to serve as a column element 102, and is capable of being joined to the terminal 112 (or substrate 114) without damaging any associated electronic component. The thickness of shell 146 is less, and typically much less, than the diameter of wire core 144. Suitable materials for wire 150 include the metallic materials described above for shell 146, formed into a fine wire about 25 to 250 microns in diameter (about 1 to 10 mils). For example, as shown in FIG. 6B, wire 150 may be soldered to terminal 112 using solder 149. After being soldered in place, wire 150 optionally receives a thin coating 151, such as about 1.3 microns (about 50 micro inches) of a conductive and protective material, such as gold.

Fabricating Column Elements on a Substrate

FIGS. 6C–6E show column elements, sacrificial layers, and related materials during exemplary steps of a method for preparing an substrate 114 with a plurality (four of many shown) of column elements 102 in anticipation of tip beam components (e.g., beams 104, 160) being mounted to the tops of the column elements 102.

Substrate 114 is typically an electronic component as defined above, having a plurality of terminals 112 electrically connected to other circuit elements of the component. Substrate 114 is optionally provided with a plurality of pillar-like structures (not shown) extending from its top surface 115, to serve as polishing stops. It is not necessary to have a large number of these polishing stops, and they are readily formed with and of the same material as the substrate (e.g., ceramic). In preparation for a subsequent plating step, the top surface 115 and terminals 112 are optionally coated with a thin, continuous electrically conductive layer (not shown), as known in the art.

In an initial step, wire cores 144 are ball-bonded to selected terminals 112 of substrate 114, and cut to the desired length, using conventional wire-bonding equipment. Resulting pairs of wire cores 144 are shown in FIG. 6C. One or more wire cores 144, and typically two wire cores 144, are bonded in groups 145 to each terminal 112. Each group is positioned to be joined to a beam of a spring structure in a later operation. In an embodiment of the invention, wire cores 144 are cut to the exact length desired. More typically, wire cores 144 are cut slightly longer than their finished design length, so that no wire 144 will be shorter than the design length in view of known manufacturing error tolerances. As previously described, wire cores 144 are positioned approximately perpendicular to substrate 114; alternatively, the wires are slightly off-perpendicular and substantially parallel to one another, to facilitate closer spacing using typical wire-bonding equipment.

Prior to forming shells 146 on cores 144, substrate 114 is preferably masked with a suitable masking layer (not shown), such as a photo-resist material, as known in the art. For example, in a typical application, the entire top surface 115 of substrate 114 is masked, except for terminals 112 and the wire cores 144. This mask may be applied before or after cores 144 are bonded to terminals 112. Shells 146 are then deposited on wire cores 144 and the exposed portions of terminals 112 using a suitable method, such as electroplating. As previously described, shells 146 may comprise more than one layer of material, with each layer being separately applied. After the desired layer or layers of shell material have been deposited, the masking layer (and exposed portions of shorting layer, if present) are removed as known in the art, revealing the free-standing column elements 102 as shown in FIG. 6D. These column elements may be suitable as is for joining to beam components. However, in an optional embodiment of the invention, the column tops 122 are first planarized as described below, to ensure that all column tops reside in substantially the same plane.

To planarize the column tops 122, substrate 114 is coated with a layer of a suitable casting material 148. Casting material 148 preferably comprises a material that is firm enough to support the column elements, is amenable to planarization processes such as chemical-mechanical polishing, and is readily removed from substrate 114 after a polishing step. Suitable materials include hard waxes or polymers having a low melting point, or which are readily dissolved. Such materials may contain a relatively high proportion of an inert filler material to stiffen them and make them more amenable to polishing. Casting materials are well known, as are methods for removing them. Casting material 148 serves to support the column elements 102 during a polishing (planarization) step. In FIG. 6E, column tops 122 are shown protruding slightly from the top surface 147 of the casting material 148, although it should be appreciated that tops 122 may also be completely covered by the casting material. The top surface 147 of the casting material 148 is then subjected to polishing, as known in the art. The aforementioned polishing stops are optionally used to determine the final position of the polished surface. Various other methods as known in the art may also be used. After the planarization process, the tops 122 of column elements 102 are substantially in the same plane.

After having planarized the tips of the column elements, the casting material 148 is removed, such as by being melted away by application of heat, or by dissolution in a suitable solvent. If present, polishing stops may also be removed at this time. As shown in FIG. 6F, the column elements 102 are thus prepared to receive beam components in a subsequent step, described below. Because in a preferred embodiment tops 122 of column elements 102 have been planarized, the beam components which are later joined to the column elements will also be substantially coplanar with one another. It is contemplated, however, that certain structural arrangements will not impose a co-planarity requirement among the beam components. The beam components may be fabricated and joined to column elements 102 by various methods as disclosed in the U.S. patents and applications referenced herein, and in particular, the parent application, Ser. No. 09/023,859, referenced above. The tip structures may also, in turn, be manufactured and joined to the beam components by the methods disclosed in the parent application, Ser. No. 09/023,859, and the other U.S. patents and applications referenced herein. A brief description of a method of assembling a spring structure using beam and tip components manufactured according to the above-referenced parent application is provided below. It should be apparent various other methods may also be used to make the structures described herein.

Fabricating Beam Components on a Sacrificial Substrate

Figure 7A:
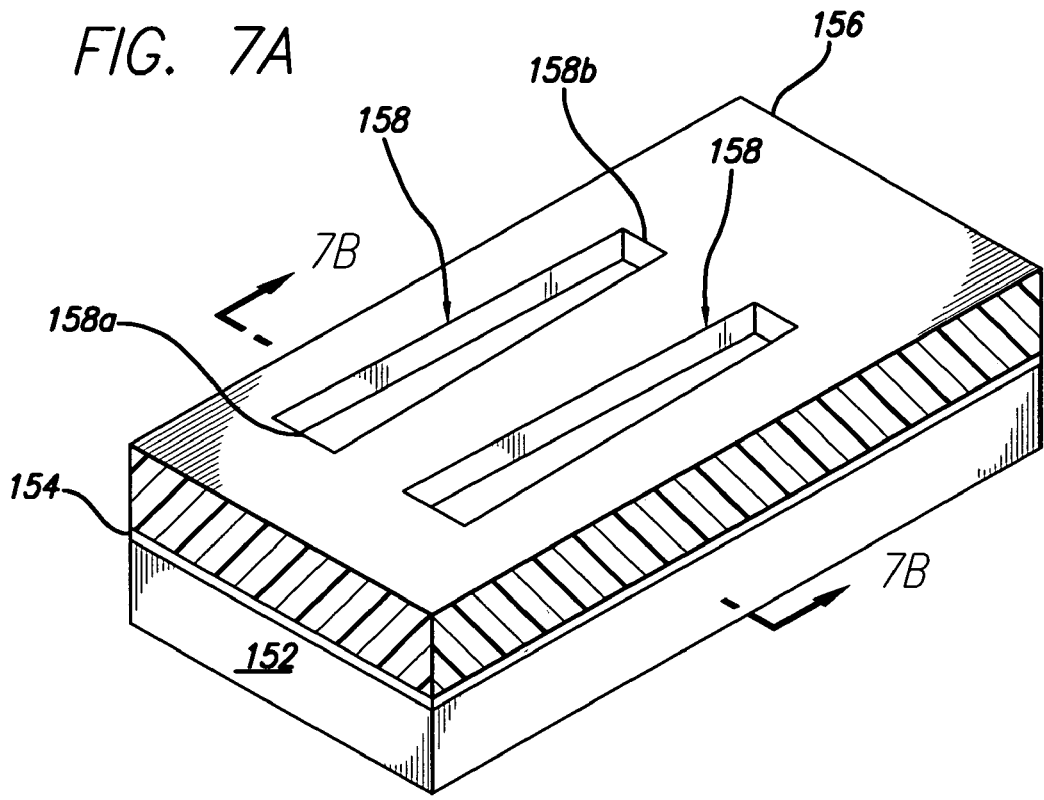
FIGS. 7A, 7C, and 7E are perspective views of microelectronic spring structure components, sacrificial substrates, and related materials during exemplary steps of a method for making a composite microelectronic spring structure.
Figure 7B:
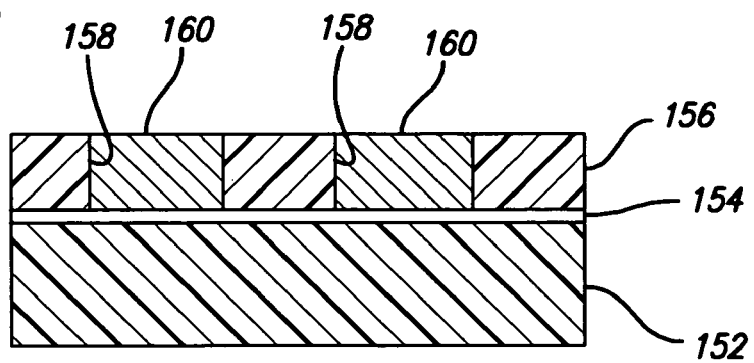
FIGS. 7B and 7D are side views of microelectronic spring structure components, sacrificial substrates, and related materials during exemplary steps of a method for making a composite microelectronic spring structure.

FIGS. 7A–7B show beam components 160, sacrificial substrate 152, and related materials during exemplary steps for making a plurality (two of many shown) of beam components 160 for microelectronic contact structures. In FIG. 7A, a plurality of openings 158 are formed in a layer of masking material 156 which is disposed on a surface of a sacrificial substrate 152. Preferably, a release layer 154 is disposed between the sacrificial substrate 152 and the masking layer 156, as known in the art. Release layer 154 may also serve as a shorting layer for plating; alternatively, a separate shorting layer (not shown) may be present over release layer 154.

For making a beam component 160, openings 158 are preferably elongate, i.e., are at least twice as long as they are wide, and more typically, more than three times longer than they are wide. Each opening 158 has a first end 158a and an opposite end 158b which will correspond to the first end 160a and opposite end 160b of the beam component 160 formed therein. As shown, the first end 158a is somewhat wider than the opposite end 158b of the opening 158 and, as will be seen, a first end 160a of the resulting elongate beam component 160 will likewise be wider than the opposite second end 160b of the beam component 160, thereby defining a trapezoidal shape. Other shapes suitable for making a beam, particularly a resilient elongate beam, are known or within the skill in the art. In particular, sloped and/or contoured beams, such as shown in FIGS. 5A–5B, may be defined by suitable forming of a sacrificial layer disposed on substrate 152, as further described in the co-pending, co-owned application Ser. No. 09/710,539, filed Nov. 9, 2000, which is incorporated herein by reference.

As shown in FIG. 7B, the openings 158 in the masking layer 156 are filled with one or more layers of metallic material, resulting in a plurality of beam components 160 for spring contact elements on sacrificial substrate 152. A variety of methods may be used to deposit a resilient material in the openings, including but not limited to electroplating, electroless plating, CVD, PVD, or sputtering; or such as further described in the co-pending applications referenced above.

Joining Beam Components to Column Elements

Figure 7C:
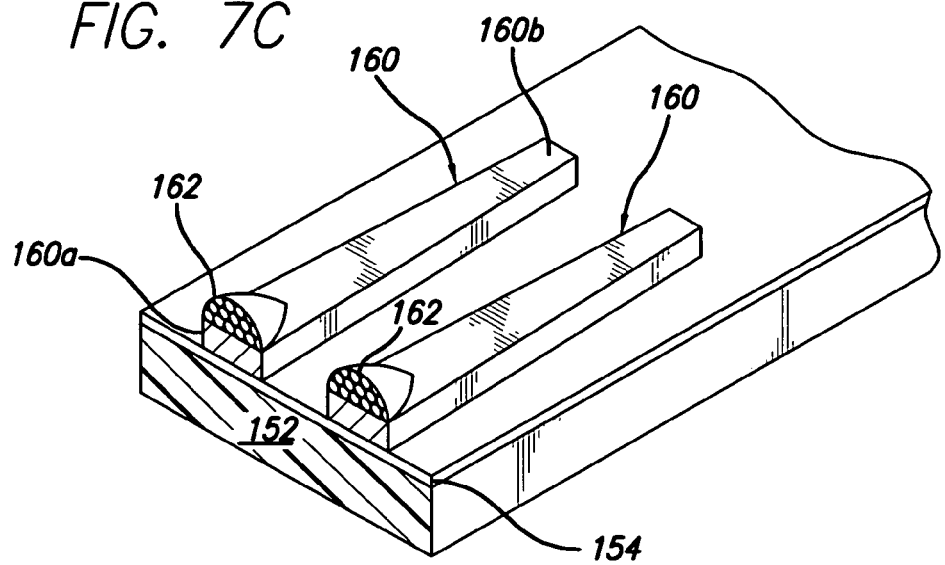

Subsequently, as shown in FIG. 7C, the masking material 156 is removed and a joining material, such as solder paste 162, or equivalent material, is applied to a portion of the exposed surfaces of the beam components 160. The joining material should be precisely and accurately measured and applied to the beam components, to ensure that the subsequent bonded joints have a uniform size and shape across a substrate. Similar considerations apply to other components, such as tip components, joined to components of a spring structure using an applied joining material according to the present invention. Various methods are known in the art, such as screen printing or using metering equipment, for controlling application of the joining material. The beam components 160, resident on the sacrificial substrate 152, with or without the masking material 156 and preferably prior to applying the solder paste 162, constitute an interim product which may be warehoused for future use.

Figure 7D:
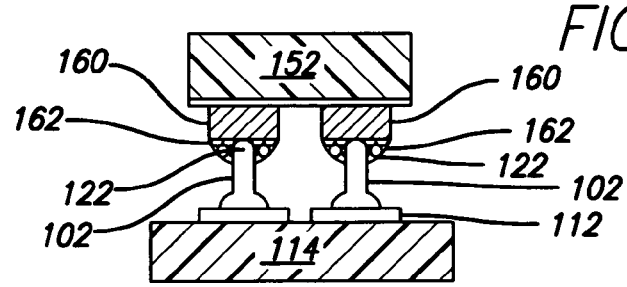

Next, as shown in FIG. 7D, the sacrificial substrate 152 with beam components 160 resident thereon and prepared with solder paste 162 is brought into contact with a top 122 of the column elements 102 which previously were joined to the terminals 112 of substrate 114. The layout of the first ends 160a of the beam components 160 "mirrors" the layout of the groups 145 of column elements 102 on substrate 114. Then, by applying heat, the solder paste 162 is reflowed so that the beam components 160 are joined to the column elements 102. With a suitable heat-release process using release layer 154, the sacrificial substrate 152 will release the beam components 160 during the solder reflow heating step. Alternatively, as described in the parent cases referenced above, the sacrificial substrate 152 is released from the beam components 160 by exposure to a suitable solvent or other chemical.

Figure 7E:
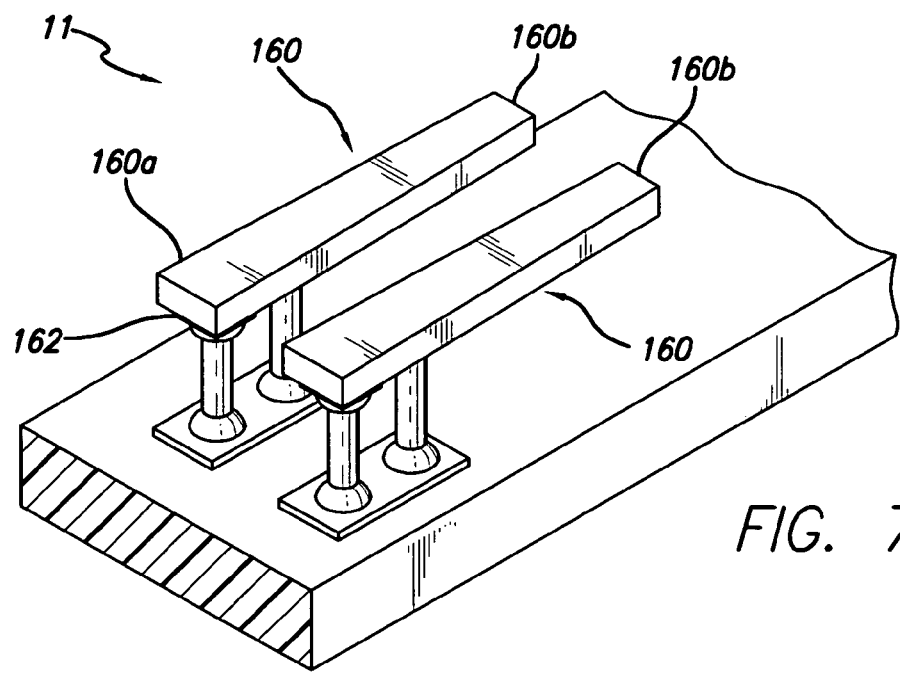

A plurality of elongate cantilever beam components 160 result, each of which is joined at first end 160a to a corresponding group 145 of column elements 102 which extend from terminals 112 of substrate 114, as shown in FIG. 7E. Microelectronic spring structures such as previously described and shown, e.g., in FIGS. 1–5D above, may thus be fabricated. Fabrication may be continued by addition of tip structures as described below.

In an alternative embodiment, the above sequence of steps may be modified by first forming each group 145 of column elements 102 attached to the first ends 160b of beam component 160 while the beam components are attached to sacrificial substrate 152. The column elements are preferably formed on first ends 160b using the techniques described above, i.e., by ball-bonding a relatively fine, soft wire core to first ends 160b, and then over-coating with a shell of more rigid material. Solder paste 162 is applied to the tops of the column elements (which are optionally first planarized by suitably adapting the planarization process described above). The column elements can then be joined to the terminals of an electronic component, by adapting the reflow process described above. Suitable detailed adaptations for modifying the above processes as outlined above will be ascertainable to one skilled in the art.

Fabricating Tip Components

FIGS. 8A–8F show components of microelectronic spring structures during exemplary steps for fabricating a plurality (two of many shown) of tip components 176 on a sacrificial substrate 164, and transferring the tip components to beam components 160. The steps described below for fabricating a tip component, and for joining a tip component to a beam component, are essentially the same as those steps described in the parent application, Ser. No. 09/023,859, referenced above. It should be apparent the tip structure and joining method described are only one of many possible tip structures and joining methods that may be used with the column elements of the present invention. Many other types of tip structures may be combined with the column elements and beam of the present invention, or tip components may be omitted entirely, without departing from the scope of the invention described herein.

Figure 8A:
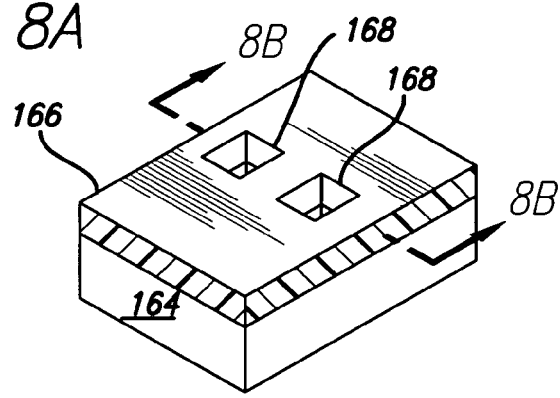
FIGS. 8A, 8C, and 8F are perspective views of microelectronic spring structure components, sacrificial substrates, and related materials during exemplary steps of a method for making a composite microelectronic spring structure having a separate tip component.

In FIG. 8A, a plurality of openings 168 are formed in a layer of masking material 166 (e.g., photo-resist), which is disposed on a surface of a sacrificial substrate 164. Substrate 164 preferably comprises a silicon material. Preferably, tip component 176 is constructed to be releasable from substrate 164 without the use of a separate release layer, using one of the methods described in one of the co-pending parent applications, Ser. No. 08/819,464 referenced above. Alternatively, one or more release layers (not shown) may be provided between the sacrificial substrate and the masking layer.

Figure 8B:
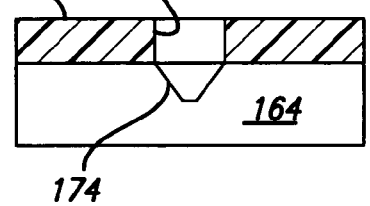
FIGS. 8B, 8D, and 8E are side views of microelectronic spring structure components, sacrificial substrates, and related materials during exemplary steps of a method for making a composite microelectronic spring structure having a separate tip component.

As shown in FIG. 8B, in a first etch step, a pit 174 is etched into the sacrificial substrate 164. Utilizing anisotropic etch properties of crystalline silicon, a pit in the form of an inverted pyramid can be formed in this manner, by allowing the etching to proceed until it reaches a self-limiting point, as known in the art. Alternatively, as shown, the etching process can be stopped before the self-limiting point, resulting in a pit having the shape of an inverted truncated pyramid with a small flat apex, as shown in FIG. 8B. It should be apparent that pit 174 may be omitted entirely if a flat tip component 176 is desired.

After formation of pit 174, masking layer 166 is removed from substrate 174. A layer of titanium (not shown) is optionally deposited (e.g., by sputtering) onto the top surface of the silicon substrate 164. The titanium layer preferably has a thickness of approximately 250 Angstroms. A layer of aluminum (not shown) is deposited (e.g., by sputtering) atop the titanium layer, preferably having a thickness of approximately 10,000 Angstroms. The titanium layer is optional and serves as an adhesion layer for the aluminum layer. A layer of copper (not shown) is then deposited (e.g., by sputtering) atop the aluminum layer, preferably having a thickness of approximately 5,000 Angstroms.

A second masking layer 170 is then applied over the sacrificial substrate 164 and metal layers thereon. Layer 170 is preferably deposited in a uniform layer that is at least as thick as the desired tip structure. Typically, layer 170 is about 25 to 250 microns (about 1 to 10 mils) thick. Layer 170 is patterned to have openings 172 aligned with the pits 174. Generally, it is preferable to pattern the photoresist with additional holes within which thieving structures or robbers may be fabricated in the same process steps employed to fabricate the tip components 176. This technique may also be used for fabrication of beam components 160, described above. These thieving structures serve to make the aforementioned electroplated layers more uniform in a manner that is well known and understood, by reducing abrupt gradients (non-uniformities) on the surface being plated.

Figure 8C:
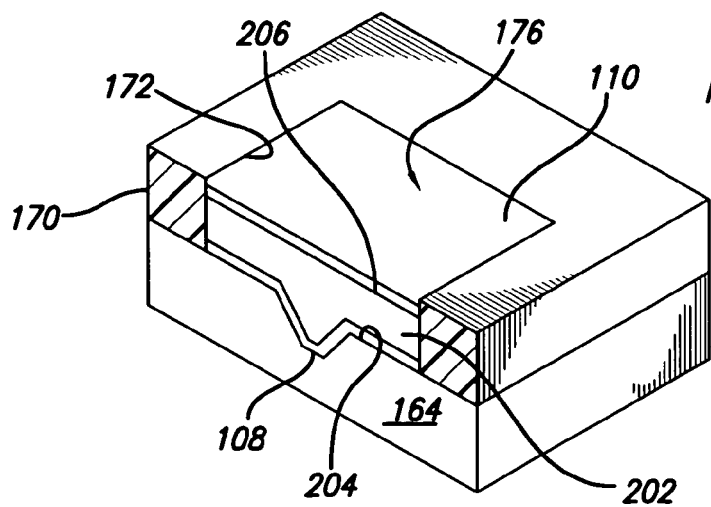

After openings 172 in the masking layer 172 are made, they are filled with one or more layers of metallic materials, as shown in FIG. 8C. Any suitable lithographic process may be used to deposit the layers of metallic material. An exemplary layered structure is described below. Alternative layered structures may be provided, such as are described in the parent cases referenced above, or as otherwise known in the art.

A layer 202 of nickel is deposited, such as by plating, onto the copper layer, preferably to a thickness of approximately 25 to 100 microns (about 1 to 4 mils). Optionally, a thin layer 204 of a noble metal such as rhodium can be deposited onto the copper layer prior to depositing the nickel. Next, a layer 206 of gold is deposited, such as by plating, onto the nickel 202. A plurality of tip components 176 for spring contact elements results, one of many as shown in FIG. 8C. Each tip component 176 is thereby preferably provided with a cutting tip 108 and a stand-off 110 integrally formed therewith.

Next, the masking layer 170 is stripped away (using any suitable solvent), leaving a plurality of fabricated tip components 176, preferably sitting atop the copper layer. Next, the copper is subjected to a quick etch process, thereby exposing an underlying aluminum layer. As will be evident, aluminum is useful in subsequent steps since it is substantially non-wettable with respect to solder and braze materials. Tip components 176 are now prepared for joining to beam components 160, as described below.

Joining Tip Components to Beam Components

Figure 8D:
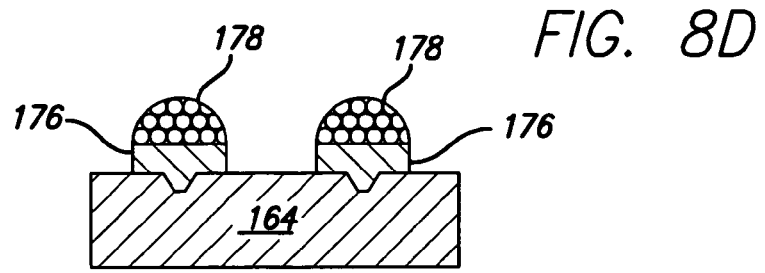

Next, the masking material 170 is removed, and a joining material, such as solder paste 178, is applied to the exposed top surfaces of the tip components 176, as shown in FIG. 8D. While resident on the sacrificial substrate 164, tip components 176, with or without the masking material 172 and preferably prior to applying the solder paste 178, constitute an interim product which may be warehoused for future use.

Figure 8E:
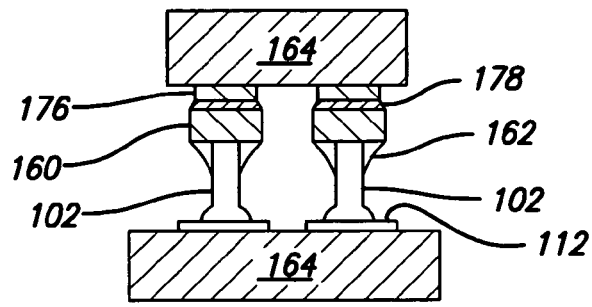
Figure 8F:
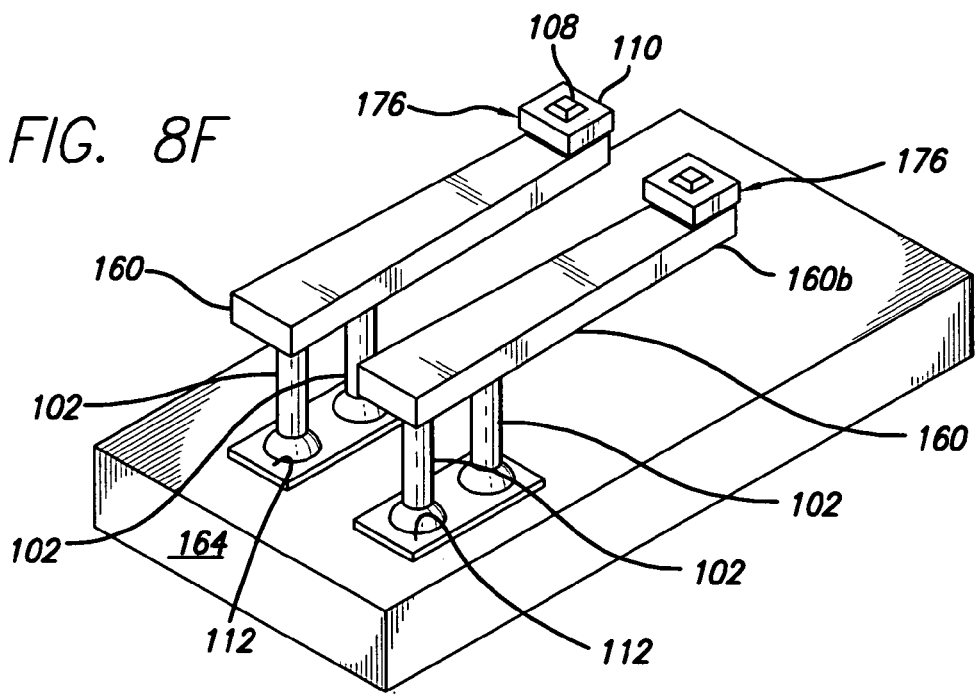

In a next step of the process, shown in FIG. 8E, the sacrificial substrate 164 with tip components 176 resident thereon (two of many tip components 176 shown) and prepared with solder paste 178 is brought into contact with corresponding top (as viewed) surfaces of the opposite ends 160b of the beam components 160. In a previous step, the beam components were joined by their first ends 160a to the column elements 102. In turn, the column elements 102 were previously joined to the terminals 112 of substrate 114. The layout of the tip components 176 mirrors the layout of the opposite ends 160b of the beam components 160. The tip components 176 and corresponding opposite ends 160b are aligned. The aligned components are secured, if desired, before permanent joining. By applying heat, the solder paste 178 is reflowed so that the tip components 176 are joined to the beam components 160. Using a suitable heat release technique, the sacrificial substrate 164 will release the beam components 176 during the solder reflow heating step. In the alternative, the sacrificial substrate 164 can be chemically caused to release from the tip components 176. A plurality (two of many shown) of microelectronic contact structures mounted to substrate 114 result, as shown in FIG. 8F.

The Joining Sequence

An exemplary embodiment is described above wherein:

(a) first, column elements are joined to a substrate, such as upon selected terminals of an electronic component;

(b) second, beam components are joined to column elements; and (c) third, tip components are joined to the beam components.

According to this exemplary sequence of events, one having ordinary skill in the art should appreciate that the material (e.g., solder paste) used for joining the beam component to the column elements should preferably have a higher melting (reflow) temperature than that of the material (e.g., solder paste) used for joining the tip component to the beam component, so that joining the tip component to the beam component does not adversely impact the joint between the beam component and the column element. Moreover, for embodiments wherein the column elements are first soldered or brazed (as opposed to plated or otherwise deposited thereon) to the terminal of the electronic component, the material (e.g., solder paste) used for joining the column elements to the terminal should preferably have an even higher melting (reflow) temperature than that of the material joining the beam component to the column element, so that joining the beam component to the column element does not adversely affect the joint between the column elements and the electronic component. Solder and braze formulations having a wide range of reflow temperatures are readily available, from which appropriate materials can be selected for each of the joints involved in assembling the microelectronic contact structure. In some cases, conductive adhesive formulations may also be appropriate for selected ones of the joints.

In a similar manner, one skilled in the art can select release methods that are compatible with reflow temperatures of the corresponding joining steps. It is within the scope of this invention that other sequences can be employed for joining components of a microelectronic contact structure to one another. For example, the beam components can first be joined to the tip components, then the sacrificial substrate supporting the beam components can be removed (without removing the sacrificial substrate supporting the tip components), then the beam components with tip components already joined thereto can be joined to the column elements. This sequence affords the opportunity to utilize a very high melting temperature joining material to join the beam components and the tip components, because the electronic component to which the microelectronic contact structures are ultimately joined is thereby not subjected to the very high temperatures involved. In a similar manner the beam components can first be joined to the column elements, then the column elements with beam components already joined thereto can be joined to the electronic component. This sequence similarly permits use of a very high melting temperature joining material, or a ball-bonded and plated joint, to join the column elements to the beam components. Other variations of the joining sequences described hereinabove are within the scope of the invention.

Overlapping Spring Contact Elements

Figure 9A:
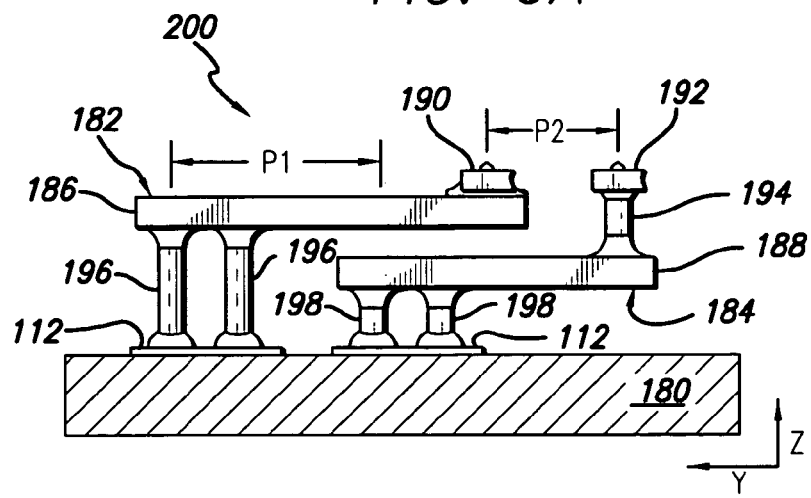
FIG. 9A is a side view of overlapping composite, dual-column microelectronic spring structures, having tips disposed at a finer pitch than the pitch of their column elements.
Figure 9B:
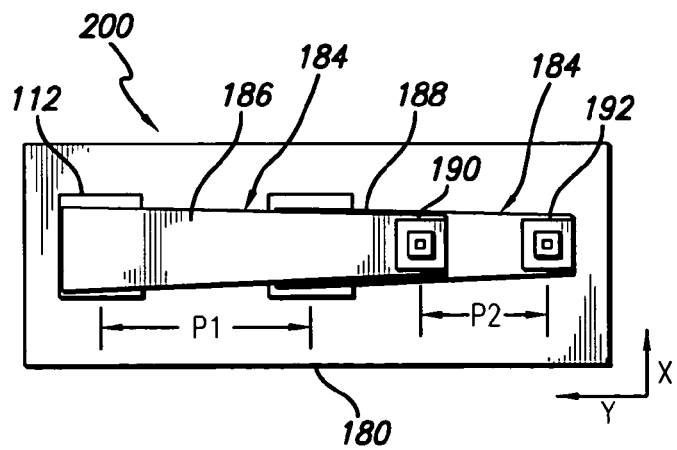
FIG. 9B is a plan view of the structure shown in FIG. 9A.

FIGS. 9A and 9B illustrate mounting a plurality (two of many shown) of multicomponent spring contact elements 182 and 184 to a corresponding plurality of terminals 112, of an electronic component 180 in a configuration 200 wherein the beam components 186 and 188, respectively, of the spring contact elements 182 and 184 are overlapping (e.g., have common x-y coordinates, but different z-axis coordinates).

The terminals 112 are spaced a distance "P1" apart on the surface (top, as viewed) of the electronic component 180. The two terminals 112 need not be adjacent terminals, but for adjacent terminals, this would be their "pitch."

To permit the beam component 186 of the one spring contact element 182 to overlap the beam component 188 of the other spring contact element 184, it should be elevated above the surface (top, as viewed) of the electronic component 180 higher than the beam component 188 of the other spring contact element 184. To this end, the column elements 196 to which the beam component 186 is joined should be taller, overall, than the column elements 198 to which the beam component 188 is joined. For contacting terminals of another electronic component (not shown) which are typically coplanar, the tip components 190 and 192 of the spring contact elements 182 and 184, respectively, should also be coplanar, including any tip features projecting from the tip components. Given that the beam component 188 is disposed closer to the surface (top, as viewed) of the electronic component 180, the tip component 192 must be taller, overall, than the tip component 186. These objects may be achieved in the following manner.

First, the shorter column elements 198, for spring contact element 184, are fabricated on a selected terminal 112 in the manner described above. Then, beam component 188 is formed and joined to the column elements 198. Subsequently, the taller column elements 196 are fabricated on the adjacent terminal 112. During their formation, columns 196 are preferably electrically isolated from columns 198 and beam 188, so that materials may be selectively plated onto the wire cores used to make column elements 198. Electrical isolation may be accomplished, for example, by suitable use of a masking layer with an underlying shorting layer. In the alternative, taller columns 196 are fabricated on a sacrificial substrate and joined to the adjacent terminal 112 using a joining material such as solder. The desired height difference between columns 196 and columns 198 is achieved by cutting their respective wire cores to predetermined different lengths during their fabrication. A first end of the beam component 186 is then joined to the top of the taller column elements 196.

The tip components 190, 192 are then fabricated on a planar sacrificial substrate, and positioned for joining to the free ends of beam components 186, 188, respectively. A spacer component is joined to tip 192, preferably while both tips 190 and 192 are still attached to the sacrificial substrate. The tips are then joined to their respective beam components using one of the method(s) described in the referenced pending U.S. applications, resulting in the overlapping spring structures 182 and 184 shown in FIG. 9A. A plan view of the configuration 200 is shown in FIG. 9B. It should be appreciated that use of wire-formed column elements 196, 198 and spacers 194 greatly facilitates formation of overlapping spring structures, by reducing the time required to fabricate spacers for positioning the beam components at different heights relative to the substrate 180, and to position the tip components at different heights relative to their respective beam components.

As illustrated, the beam components 186 and 188 both extend in the y-axis, at the same x-axis coordinates. In other words, the beam component 186 is positioned directly over and parallel to the beam component 188, as contrasted with simply crossing over it. If the two beam components 186 and 188 were the same length (as measured between their two ends), the tip components 190 and 192 would be spaced the same distance apart ("P2") as the terminals 902 and 904. However, as illustrated, the beam component 188 is shorter (in the y-axis) than the beam component 186. In this manner, the tip components 190 and 192 are space a distanced "P2" apart, which can be less than the distance "P1". This effects a degree of space transformation (pitch spreading) with the spring contact elements themselves. For example, the electronic component 180 can be the space transformer component of a probe card assembly, having terminals disposed at a first pitch (spacing from one another), and the tip components can be spaced at a second, finer pitch.

The example of spacing the tip components at a finer pitch than the terminals of the electronic component is but one example of many and various space translations that can be implemented by having the beam components of selected ones of a plurality of microelectronic contact structures crossing over, or disposed above, the beam components of selected other ones of a plurality microelectronic contact structures. For example, it should be appreciated that it is not necessary for beam components to overlap or cross one another to accomplish a degree of space transformation. Space transformation can also be accomplished by configuring beams in a diverging or converging pattern in a common plane. Suitable design of diverging, converging, and/or overlapping configurations will depend on the specific requirements of the application.

Alternatives for Joining Columns to Beams

Figure 10A:
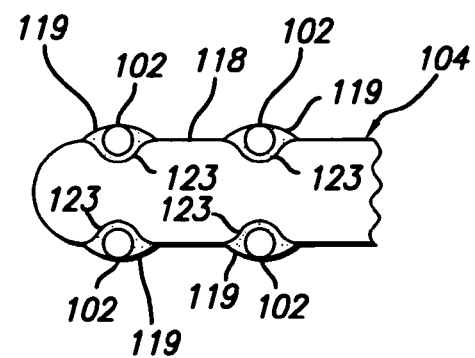
FIG. 10A is a partial plan view of an end of a beam component, showing an alternative structure for attaching a beam component to plural column elements.
Figure 10B:
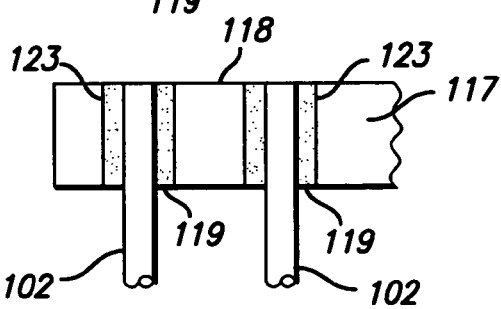
FIG. 10B is a partial side view of the structure shown in FIG. 10A.

In the embodiments described thus far, the column elements 102 are characteristically joined to beams 104 having their column tops 122 butted against a surface of the beam. However, columns may be joined to beams using other suitable configurations. For example, columns may be joined to beams in an overlapping relationship, as shown in FIGS. 10A and 10B. A plan view of an exemplary fixed end 118 of a beam 104, having column elements 102 joined in an overlapping relationship, is shown in FIG. 10A. A corresponding side view is shown in FIG. 10B. Beam 104 is preferably provided with vertical channels 123 that partially enclose an upper end of each column element 102. As an alternative to channels 123, other shaped features such as wells or through holes (both not shown) may be provided; or channels 123 or other shaped features may be omitted entirely. A joining material 119, such as solder or braze, is applied between column elements 102 and the interior walls of channels 123 (or wells or holes, if used). If no channels, wells, or holes are present, column elements 102 may be joined directly to the side 117 of beams 104.

It should be appreciated that the beams can be pressure fitted between columns 102, to replace or supplement the joining material. Also, the columns and beam ends may be provided with interlocking or interconnection features. In addition, more than one beam may be attached to the same set of column elements. For example, the configuration shown in FIGS. 10A and 10B is advantageous for attaching two or more beams (not shown) in a stacked, spaced apart relationship to the same set of columns. It should also be understood that one of such stacked beams may be secured on or between column elements 102 such that the column elements extend above an upper surface of the beam. A second beam may then be mounted on the same columns 102, at a point above the first beam. Additional beams may be similarly be joined the columns above the second beam, if desired. The plurality of beams that are thus joined to the same group of column elements may extend from the columns in substantially the same direction, and in an overlapping relationship. Alternatively, each beam of the plurality of beams may extend in a different direction, such as in opposite directions.

Figure 11B:
FIGS. 11B and 11C are partial side views of dual column elements, wherein each column comprises a gold-tin eutectic layer, during successive steps of a method for bonding a beam component to the column elements.
Figure 11A:
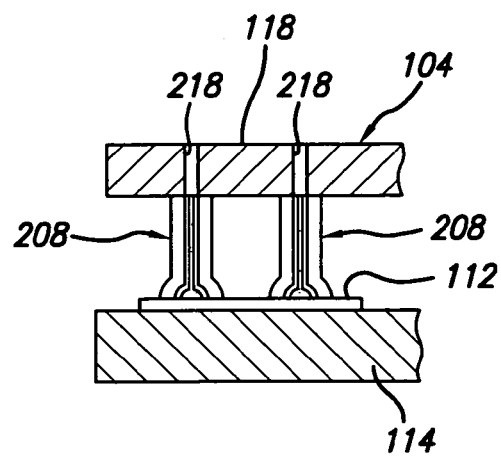
FIG. 11A is a detail perspective view of an exemplary column structure incorporating gold and tin layers in a eutectic ratio.
Figure 11C:
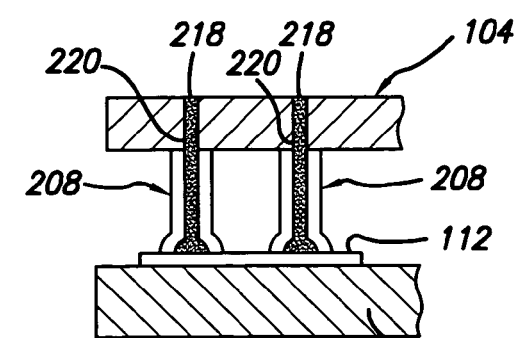

As an alternative to using a separately applied joining material, such as a solder paste or a conductive adhesive, the column elements may be constructed of materials that are capable of joining the column elements to a beam surface. An exemplary column element 208 having an inherently joinable construction is shown in FIG. 11A. The various layers of column element 208 are shown at its top 210. Column 208 comprises a wire core 212 of gold, as previously described. The core 212 is coated with a layer of tin 214, in a eutectic ratio with the gold in core 212. A shell 216 of a higher-melting point material, such as nickel, encloses the gold core 212 and tin layer 214. The gold core 212 and tin layer 214 may be used to join the column top 210 to a beam component. Views of the columns 208 and related materials during exemplary steps of a suitable joining process are shown in FIGS. 11B–11C.

Initially, the column elements 208 are joined to a terminal 112 and/or a substrate 114 as previously described, i.e., by ball-bonding the core 208 to the terminal or substrate, and then plating or otherwise depositing the subsequent layers 214, 216 on the core. Column elements 208 are then planarized as previously described, to expose the internal core 212 and tin layer 214 at top 210. A beam component 104 is then butted against the column tops, as shown in a cross-sectional view in FIG. 11B. Beam 104 is optionally provided with holes 218 in its end 118. Holes 218 are preferably aligned with the cores 212 of column elements 208.

The column elements are then heated until the tin layer 214 and gold core 212 melt and combine. Shell 126 expands, but does not melt, during the heating process, thereby pressing the molten gold/tin eutectic material 220 out between a lower surface of beam 104, and into holes 218. The column elements 208 and beam 104 are then cooled, thereby hardening the gold/tin material 220 and joining column elements 208 to beam 104.

Having thus described a preferred embodiment of a composite microelectronic contact structure, including various spring structures, it should be apparent to those skilled in the art that certain advantages of the within system have been achieved. It should also be appreciated that various modifications, adaptations, and alternative embodiments thereof may be made within the scope and spirit of the present invention. For example, structures for functioning as electrical contact elements have been illustrated, but it should be apparent that the inventive concepts described above would be equally applicable to similar structures for other uses, such as electromechanical switches and purely mechanical spring elements. The invention is further defined by the following claims.

What is claimed is:

1. A microelectronic contact structure, comprising:
   a plurality of substantially rigid column elements, each of said plurality of column elements comprising:
      a core element comprising a segment of wire attached at a first end to a terminal of an electronic component, and
      an over coat covering at least a portion of said core element, wherein said core element comprises a first material and said over coat comprises a second material, and said first material is one of softer, less rigid, or has a lower modulus of elasticity than said second material; and
   a contact element that is joined to a second end of each of said plurality of column elements.

2. The microelectronic contact structure of claim 1, wherein said contact element further comprises a beam formed of a resilient material.

3. The microelectronic contact structure of claim 1, wherein said contact element further comprises a contact pad joined to each of said column elements.

4. The microelectronic contact structure of claim 1, wherein said column elements are substantially straight and parallel to one another.

5. The microelectronic contact structure of claim 2, wherein said beam is positioned transverse to each of said plurality of column elements and joined to each of said column elements.

6. The microelectronic contact structure of claim 1, wherein said column elements are inclined to said contact element at an angle between 70° and 110° excluding 90°.

7. The microelectronic contact structure of claim 1, wherein said column elements are perpendicular to said contact element.

8. The microelectronic contact structure of claim 1, wherein each of said column elements is substantially cylindrical.

9. The microelectronic contact structure of claim 2, wherein said beam is sloped away from said column elements.

10. The microelectronic contact structure of claim 2, further comprising a sacrificial substrate joined to said beam.

11. The microelectronic contact structure of claim 2, wherein said beam is contoured.

12. The microelectronic contact structure of claim 2, wherein said beam is fabricated by a lithographic process that includes depositing said resilient material on a sacrificial substrate.

13. The microelectronic contact structure of claim 2, further comprising a tip structure positioned on a surface of said beam opposite to said plurality of column elements.

14. The microelectronic contact structure of claim 2, wherein said beam has a free end cantilevered from said plurality of column elements.

15. The microelectronic contact structure of claim 14, further comprising a tip structure positioned on said beam between said free end of said beam and said plurality of column elements.

16. The microelectronic contact structure of claim 15, wherein said tip structure is positioned on a surface of said beam opposite to said column elements.

17. The microelectronic contact structure of claim 15, wherein said tip structure is positioned adjacent to said free end of said beam.

18. The microelectronic contact structure of claim 15, wherein said tip structure comprises a stand-off mounted to said beam, and a contact tip mounted to said stand-off.

19. The microelectronic contact structure of claim 1, further comprising said substrate joined to each of said column elements at said base thereof.

20. The microelectronic contact structure of claim 2, further comprising said substrate joined to each of said column elements at said base thereof, and wherein said beam has a free end cantilevered from said column elements.

21. The microelectronic contact structure of claim 20, wherein said microelectronic spring structure is configured such that said top of each of said column elements is substantially fixed while said free end of said beam will deflect under a force applied to said beam at said free end in a direction transverse to said substrate.

22. The microelectronic contact structure of claim 1, wherein said first material is softer than said second material.

23. The microelectronic contact structure of claim 1, wherein said first material is less rigid than said second material.

24. The microelectronic contact structure of claim 1, wherein said first material has a lower modulus of elasticity than said second material.

25. The microelectronic contact structure of claim 1, wherein said over coat anchors said core element to said terminal of said electronic component.

26. A microelectronic contact structure, comprising:
a column element comprising a top and a base, and wherein said base is positioned for attachment to a substrate; and
a cantilevered, elongate beam, a first portion of said beam joined to said top of said column element, and a second portion of said beam disposed away from said column element and free to deflect independent of said first portion,
wherein said column element comprises a wire.

27. The microelectronic contact structure of claim 26 further comprising a plurality of column elements each comprising a top and a base, wherein each said base is positioned for attachment to said substrate, and said beam is joined to said tops of each of said plurality of column elements.

28. A microelectronic contact structure, comprising:
a plurality of substantially rigid column elements, each of said plurality of column elements comprising:
a core element attached at a first end to a terminal of an electronic component, and
an over coat covering at least a portion of said core element, wherein said core element comprises a first material and said over coat comprises a second material, and said first material is one of softer, less rigid, or has a lower modulus of elasticity than said second material; and
a contact element joined to a second end of said plurality of column elements,
further comprising a substrate joined to each of said column elements at said base thereof, and wherein said contact element comprises a beam and said beam has a free end cantilevered from said column elements,
wherein said microelectronic spring structure is configured such that said top of each of said column elements is substantially fixed while said free end of said beam will deflect under a force applied to said beam at said free end in a direction transverse to said substrate, and
each of said column elements is connected at said base thereof to a terminal of said substrate, and further comprising a connector comprising a wire core joined to said terminal of said substrate, and connected to a second terminal of said substrate.

29. A substrate having a plurality of microelectronic spring structures mounted thereto, wherein each of said microelectronic spring structures comprises:
at least two substantially rigid column elements, wherein each column element has a top and a base, and is joined to said substrate at said base; and
a beam comprising a column connection region and a contact tip region and joined to each of said column elements at said column connection region, wherein said beam is positioned transverse to each of said column elements and said column elements are positioned such that the top of one of said column elements is positioned between the top of said other column element and the contact tip region of said beam.

30. The substrate of claim 29, wherein said substrate comprises a probe card.

31. The substrate of claim 29, wherein said substrate comprises a semiconductor material containing an integrated circuit.

32. The substrate of claim 29, wherein said substrate comprises an interposer.

33. The substrate of claim 29, wherein said substrate comprises a space transformer.

34. The substrate of claim 29, wherein said substrate comprises an electrical connector.

35. A substrate-mounted microelectronic spring structure, comprising:
a substrate;
a substantially rigid column element having a top and a base, and joined at said base to said substrate, wherein said column element comprises a substantially straight segment of wire; and
a resilient cantilevered beam having a free end, and joined to said top of said column element at a joint a distance away from said free end;
wherein said microelectronic spring structure is configured such that said top of said column element is substantially fixed while said cantilever beam permits elastic deflection of said free end thereof under a force applied to said beam at said free end towards said substrate.

36. The microelectronic spring structure of claim 35, wherein said column element is inclined to said beam at an angle between 70° and 110° excluding 90°.

37. The microelectronic spring structure of claim 35, wherein said resilient cantilevered beam is sloped away from said substrate.

38. The microelectronic spring structure of claim 35, wherein said resilient cantilevered beam is contoured in a direction perpendicular to said substrate.

39. The microelectronic spring structure of claim 35, wherein said resilient cantilevered beam is fabricated by a lithographic process that includes depositing said resilient material on a sacrificial substrate.

40. The microelectronic spring structure of claim 35, further comprising a tip structure positioned on a surface of said beam opposite to said column element.

41. The microelectronic spring structure of claim 35, wherein said tip structure is positioned adjacent to said free end of said beam.

42. The microelectronic spring structure of claim 41, wherein said tip structure comprises a stand-off mounted to said beam, and a contact tip mounted to said stand-off.

43. The microelectronic spring structure of claim 35, wherein said column element comprises a wire core enclosed in a shell comprising at least one shell material.

44. The microelectronic spring structure of claim 43, wherein said shell is formed by plating said shell material onto said wire cores.

45. The microelectronic spring structure of claim 43, wherein said wire core is ball-bonded to said substrate.

46. The substrate-mounted microelectronic spring structure of claim 35 further comprising a plurality of said colunm elements.

47. The substrate-mounted microelectronic spring structure of claim 35, wherein said substrate-mounted microelectronic spring structure includes only one column element.

48. A microelectronic spring structure, comprising:
    substrate means for supporting a structure:
    support means for supporting a beam, for securing a beam to said substrate means, and for elevating a beam above said substrate means, wherein said support means comprises at least one substantially rigid column element having an at least partially over coated core element, wherein said core element comprises a first material and said over coat comprises a second material, and said first material is one of softer, less rigid, or has a lower modulus of elasticity than said second material; and
    resilient beam means for contacting an electronic component, said resilient beam means supported by said support means,
    wherein said core element of said at least one column element comprises a segment of wire.

49. The microelectronic spring structure of claim 48, wherein said support means comprises a group of said substantially rigid column elements.

50. The microelectronic spring structure of claim 48, wherein said resilient beam means comprises a substantially straight beam of resilient material.

51. The microelectronic spring structure of claim 48, wherein said resilient beam means comprises a beam of resilient material contoured in a direction perpendicular to said substrate.

52. The microelectronic spring structure of claim 48, further comprising contact tip means for contacting a terminal of an electronic component, said contact tip means supported by and secured to said resilient beam means.

53. The microelectronic spring structure of claim 52, wherein said contact tip means comprises a stand-off, and a contact tip mounted to said stand-off.

54. The microelectronic spring structure of claim 48, wherein said first material is softer than said second material.

55. The microelectronic spring structure of claim 48, wherein said first material is less rigid than said second material.

56. The microelectronic spring structure of claim 48, wherein said first material has a lower modulus of elasticity than said second material.

57. The microelectronic spring structure of claim 48, wherein said over coat anchors said core element to said terminal of said substrate means.

* * * * *